"""

US011174276B2

(12) United States Patent
Zhu et al.

(10) Patent No.: US 11,174,276 B2
(45) Date of Patent: Nov. 16, 2021

(54) ORGANIC-INORGANIC PEROVSKITE MATERIALS AND METHODS OF MAKING THE SAME

(71) Applicant: Alliance for Sustainable Energy, LLC, Golden, CO (US)

(72) Inventors: Kai Zhu, Littleton, CO (US); Mengjin Yang, Dallas, TX (US); Donghoe Kim, Superior, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 0 days.

(21) Appl. No.: 16/640,903

(22) PCT Filed: Sep. 5, 2018

(86) PCT No.: PCT/US2018/049489
§ 371 (c)(1),
(2) Date: Mar. 11, 2020

(87) PCT Pub. No.: WO2019/050906
PCT Pub. Date: Mar. 14, 2019

(65) Prior Publication Data
US 2020/0239499 A1 Jul. 30, 2020

Related U.S. Application Data

(60) Provisional application No. 62/554,963, filed on Sep. 6, 2017.

(51) Int. Cl.
C07F 7/24 (2006.01)
H01G 9/20 (2006.01)
H01L 51/00 (2006.01)
H01L 51/42 (2006.01)

(52) U.S. Cl.
CPC ............ *C07F 7/24* (2013.01); *H01G 9/2059* (2013.01); *H01L 51/0077* (2013.01); *H01L 51/0003* (2013.01); *H01L 51/42* (2013.01)

(58) Field of Classification Search
CPC ............ Y10S 502/525; C25B 11/0773; C01P 2002/34; C04B 35/4682; C04B 35/4686; C07F 7/24; H01G 9/2059; H01L 51/0077; H01L 51/0003; H01L 51/42
See application file for complete search history.

(56) References Cited

U.S. PATENT DOCUMENTS

| 10,700,229 | B2* | 6/2020 | Zhu | H01L 31/0256 |
|---|---|---|---|---|
| 10,797,255 | B2* | 10/2020 | Snaith | H01L 51/0007 |
| 10,889,756 | B2* | 1/2021 | Luchinger | C07F 9/142 |
| 10,941,165 | B2* | 3/2021 | Luther | H01L 31/032 |
| 2016/0035496 | A1 | 2/2016 | Irwin | H01L 51/0003 136/265 |
| 2017/0053746 | A1* | 2/2017 | Belcher | H01L 51/0032 |
| 2017/0089128 | A1 | 3/2017 | Wheeler et al. | |
| 2017/0133163 | A1* | 5/2017 | Russell | H01L 27/302 |
| 2017/0229249 | A1 | 8/2017 | Snaith et al. | |
| 2017/0243699 | A1* | 8/2017 | Beaumont | H01G 9/2009 |
| 2018/0254362 | A1* | 9/2018 | Zeng | H01L 31/032 |
| 2019/0241802 | A1* | 8/2019 | Wheeler | C07F 7/24 |
| 2019/0292375 | A1* | 9/2019 | Irwin | C09D 11/52 |
| 2019/0330248 | A1* | 10/2019 | Panthani | H01L 51/4226 |
| 2020/0055882 | A1* | 2/2020 | Luther | H01L 51/005 |
| 2020/0185630 | A1* | 6/2020 | Ke | C07F 7/24 |
| 2020/0189926 | A1* | 6/2020 | van Hest | H01L 51/422 |
| 2020/0189927 | A1* | 6/2020 | Whitaker | C01G 21/16 |
| 2020/0203633 | A1* | 6/2020 | Qin | C09K 11/06 |
| 2020/0294727 | A1* | 9/2020 | Segawa | H01L 51/0077 |

FOREIGN PATENT DOCUMENTS

| WO | 2016124555 A1 | 8/2016 | |
|---|---|---|---|
| WO | 2016207775 A1 | 12/2016 | |
| WO | WO-2016207775 A1 * | 12/2016 | ........... H01G 9/2059 |

OTHER PUBLICATIONS

J. Attfield et al., 44 Dalton Transactions, 10541-10542 (2014) (Year: 2014).*
M. Filip et al., 115 PNAS, 5397-5402 (2018) (Year: 2018).*
R. Woodward, Acta Crystallographica Section B, 32-43 (1997) (Year: 1997).*
Y. Wu et al., 139 Journal of the American Chemical Society, 16999-17002 (2017) (Year: 2017).*
S. Prathapani et al., 112Appl. Phys. Lett. (2018) (Year: 2018).*
Z. Wang et al., 2 Nature Energy, 1-10 (2017) (Year: 2017).*
M. Long, Engineering of Chemical Coordination and Optoelectronic Properties for High-Performance Perovskite Solar Cells (Doctoral Thesis 2017) (Year: 2017).*
G. Eperon et al., Nature Reviews Chemistry, 1-18 (2017) (Year: 2017).*
M Saliba et al., 9 Energy & environmental Science, 1989-1997 (2016) (Year: 2016).*
D. McMeekin et al., 351 Science, 151-155 (2016) (Year: 2016).*
Y. Lin et al., 29 Advanced Materials, 1-8 (2017) (Year: 2017).*
K. Bush et al., 2 Nature Energy, 1-7 (2017) (Year: 2017).*
W. Zhu et al., 52 Chem. Commun., 304-307 (2016) (Year: 2016).*
Z. Hu et al., 54 Chem. Commun., 2623-2626 (2016) (Year: 2016).*
P. Schulze et al., 3 7th European PV Solar Energy Conference and Exhibition, Sep. 7-11, 2020 (Year: 2020).*
English translation of CN published patent application No. 107093486, published Aug. 25, 2017, Huazhong University of Science and Technology, Tang, J. et al., 8 pages.

(Continued)

Primary Examiner — Alexander R Pagano
(74) Attorney, Agent, or Firm — Michael A. McIntyre

(57) ABSTRACT

The present disclosure relates to a method that includes treating a liquid that includes a first precursor at a concentration $C_1$, a second precursor at a concentration $C_2$, a third precursor at a concentration $C_3$, and an additive at a concentration $C_4$, where the treating results in a perovskite, each of $C_1$, $C_2$, and $C_3$ are between 0.001 M and 100 M, inclusively, and at least one of $C_4/C_1$ or $C_4/C_2$ equals a ratio greater than or equal to zero 8 Claims, 21 Drawing Sheets

(56) References Cited

OTHER PUBLICATIONS

Chen, Q. et al., "The optoelectronic role of chlorine in CH3NH3PbI3(Cl)-based perovskite solar cells," Nature Communications, Jun. 12, 2015, 9 pages.
Fang, Y. et al., "Highly narrowband perovskite single-crystal photodetectors enabled by surface-charge recombination," Nature Photonics, vol. 9, Oct. 2015, 9 pages.
McMeekin, D. et al., "A mixed-cation lead mixed-halide perovskite absorber for tandem solar cells," Science, vol. 351, Issue 6269, Jan. 8, 2016, 6 pages.
McMeekin, D. et al., "Crystallization Kinetics and Morphology Control of Formamidinium-Cesium Mixed-Cation Lead Mixed-Halide Perovskite via Tunability of the Colloidal Precursor Solution," Advanced Materials, vol. 29, 2017, 8 pages.
Yang, M. et al., Square-Centimeter Solution-Processed Planar CH3NH3PbI3 Perovskite Solar Cells with Efficiency Exceeding 15%, Advanced Materials, vol. 27, 2015, 8 pages.
Yang, M. et al., "Facile fabrication of large-grain CH3NH3PbI3-xBrx films for high-efficiency solar cells via CH3NH3Br-selective Ostwald ripening," Nature Communications, Aug. 1, 2016, 9 pages.
Yang, M. et al., "Perovskite ink with wide processing window for scalable high-efficiency solar cells," Nature Energy, vol. 2, 2017, 9 pages.
Zhao, Y. et al., "CH3NH3Cl-Assisted One-Step Solution Growth of CH3NH3PbI3: Structure, Charge-Carrier Dynamics, and Photovoltaic Properties of Perovskite Solar Cells," Journal of Physical Chemistry C, vol. 118, 2014, 7 pages.
PCT International Search Report (3 pages) and Written Opinion (4 pages) from corresponding PCT patent application No. PCT/US18/49489 dated Nov. 15, 2018, 7 pages total.

* cited by examiner

ORGANIC-INORGANIC PEROVSKITE MATERIALS AND METHODS OF MAKING THE SAME

CROSS-REFERENCE TO RELATED APPLICATIONS

This application claims the benefit of U.S. Provisional Patent Application No. 62/554,963 filed Sep. 6, 2017, the contents of which are incorporated herein by reference in their entirety.

CONTRACTUAL ORIGIN

The United States Government has rights in this disclosure under Contract No. DE-AC36-08GO28308 between the United States Department of Energy and Alliance for Sustainable Energy, LLC, the Manager and Operator of the National Renewable Energy Laboratory.

BACKGROUND

The bandgap tunability from about 1.2 eV to 2.3 eV has enabled various perovskite-related tandem PVs such as perovskite/perovskite, perovskite/Si, perovskite/CIGS tandem solar cells which is strongly considered as an alternative direction to reach over 30% efficiency. At present, the perovskite/perovskite tandem has reached 21.2% for a 4-terminal (4-T) device and 18.5% for a 2-terminal (2-T) structure, whereas the perovskite/Si tandem has reached 26.7% for 4-T and 25.2% for 2-T configurations. Therefore, a key effort for developing these tandem devices is to improve the wide-bandgap (WBG) perovskites with 1.7 eV to 1.9 eV of bandgap. Increasing the bromide portion at the halide anion position of perovskites is the common approach to developing WBG perovskite devices with various their compositions based on MA, FA, Cs or their mixtures on the A site of perovskites. In general, as the amount of substitution of iodide to bromide reaches certain range, the crystallographic, optoelectronic and chemical properties of perovskites exhibit undesired changes such as phase segregation, higher energetic disorder, and inferior light absorption. Thus, there remains a need for WBG perovskite films and devices having improved crystallographic and opto-physicochemical properties and/or performance metrics, as well as a need for improved methods for manufacturing such films and devices.

SUMMARY

An aspect of the present disclosure is a method that includes treating a liquid that includes a first precursor at a concentration $C_1$, a second precursor at a concentration $C_2$, a third precursor at a concentration $C_3$, and an additive at a concentration $C_4$, where the treating results in a perovskite, each of $C_1$, $C_2$, and $C_3$ are between 0.001 M and 100 M, inclusively, and at least one of $C_4/C_1$ and/or $C_4/C_2$ equals a ratio greater than or equal to zero.

In some embodiments of the present disclosure, the perovskite may include a first cation (A) having a 1+ valence state, a second cation (B) having a valence state of at least one of 1+, 2+, 3+, and/or 4+, and a first anion (X) having a valence state of 1−. In some embodiments of the present disclosure, the perovskite may have a composition that includes at least one of $ABX_3$, $A_2B^{1+}B'^{3+}X_6$, $A_2B^{4+}X_6$, and/or $A_3B_2^{3+}X_9$. In some embodiments of the present disclosure, the perovskite may further include a third cation (A'), and the composition may include $A_xA'_{1-x}BX_3$, where $0<x<1$. In some embodiments of the present disclosure, the first precursor may include AX, the second precursor may include A'X, the third precursor may include $BX_2$, and the additive may include at least one of AX, A'X, and/or A"X.

In some embodiments of the present disclosure, $W*C_1$ may be about equal to x, $W*C_2$ may be about equal to (1−x), $W*2*C_3$ may be about equal to one, $0.001 \le W \le 1000$, where W is a scaling factor having units of inverse concentration. In some embodiments of the present disclosure, A may include at least one of an alkylammonium, a Group I Element, and/or formamidinium. In some embodiments of the present disclosure, the alkylammonium may include at least one of methylammonium (MA), ethylammonium, and/or butylammonium. In some embodiments of the present disclosure, the Group I Element may include at least one of potassium, cesium, and/or rubidium. In some embodiments of the present disclosure, A' may include at least one of an alkylammonium, a Group I Element, and/or formamidinium. In some embodiments of the present disclosure, the alkylammonium may include at least one of methylammonium (MA), ethylammonium, and/or butylammonium. In some embodiments of the present disclosure, the Group I Element may include at least one of potassium, cesium, and/or rubidium. In some embodiments of the present disclosure, B may include at least one of germanium, tin, and/or lead. In some embodiments of the present disclosure, the ratio may be between greater than zero and less than 0.5.

In some embodiments of the present disclosure, the liquid may further include a fourth precursor that may include $BX'_2$ at a concentration $C_5$, where X' may include a second anion having a 1− valence state, the composition may include $A_xA'_{1-x}B(X_yX'_{1-y})_3$, where $0<y<1$, $W*2*C_5$ may equal about (1−y), and $W*2*C_3$ may equal about y. In some embodiments of the present disclosure, AX may include at least one of cesium iodide and/or cesium bromide, A'X may include at least one of FAI or FABr, $BX_2$ may include $PbBr_2$, $BX'_2$ may include $PbI_2$, the additive may include at least one of an alkylammonium halide, and the composition may include $FA_xCs_{1-x}Pb(I_yBr_{1-y})_3$. In some embodiments of the present disclosure, the composition may include $FA_{0.83}Cs_{0.17}Pb(I_{0.6}Br_{0.4})_3$. In some embodiments of the present disclosure, the alkylammonium halide may include at least one of MABr, MAI, or MACl. In some embodiments of the present disclosure, the perovskite may have a bandgap greater than or equal to 1.6 eV.

An aspect of the present disclosure is a perovskite defined by $A_xA'_{1-x}B_zB'_{1-z}(X_yX'_{1-y})_3$, where A is a first cation having a 1+ valence state, A' is a second cation having a 1+ valence state, B is a third cation having a 2+ valence state, B' is a fourth cation having a 2+ valence state, X is a first anion having a valence state of 1−, X' is a second anion having a valence state of 1−, and each of x, y, and z are between zero and one, exclusively.

BRIEF DESCRIPTION OF THE DRAWINGS

Exemplary embodiments are illustrated in referenced figures of the drawings. It is intended that the embodiments and figures disclosed herein are to be considered illustrative rather than limiting.

FIG. 12A illustrates J-V curves of the semi-transparent organic-organic perovskite layer (~1.75 eV) PSC under glass/FTO illumination and the Si cell with and without the semi-transparent organic-inorganic PSC optical filter. FIG. 12B illustrates EQE spectra of semi-transparent organic-inrorganic perovskite top cell and a filtered Si bottom cell.

REFERENCE NUMBERS

Figure 1:
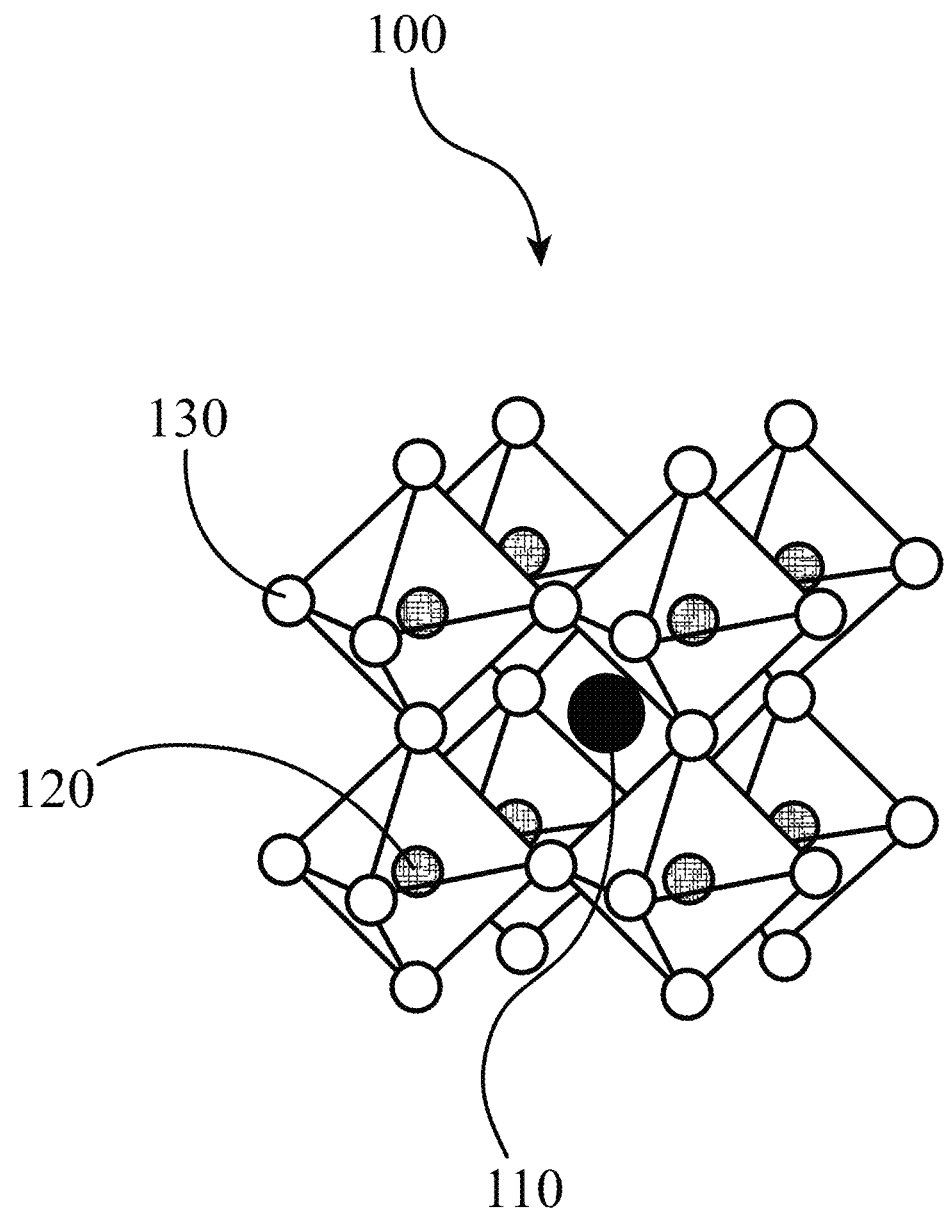
FIG. 1 illustrates a structure of an organic-inorganic perovskite, according to some embodiments of the present disclosure.

100 . . . organic-inorganic perovskite
110 . . . A-cation
120 . . . B-cation
130 . . . X-anion
200 . . . method
210 . . . combining
212 . . . first precursor
214 . . . second precursor
216 . . . $n^{th}$ precursor
218 . . . additive
219 . . . precursor solution
220 . . . applying
222 . . . liquid film
230 . . . treating
232 . . . volatiles
234 . . . organic-inorganic perovskite layer

DETAILED DESCRIPTION

The present disclosure may address one or more of the problems and deficiencies of the prior art discussed above. However, it is contemplated that some embodiments as disclosed herein may prove useful in addressing other problems and deficiencies in a number of technical areas. Therefore, the embodiments described herein should not necessarily be construed as limited to addressing any of the particular problems or deficiencies discussed herein.

The present disclosure relates to high efficiency wide-bandgap (WBG) organic-inorganic perovskite materials, crystals, and/or solar cells, including tandem devices such as all perovskite and/or perovskite/Si tandem devices. The use of non-stoichiometric precursor chemistry with excess methylammonium halides (MAX; X=I, Br, or Cl) for preparing high-quality ~1.75 eV $FA_{0.83}Cs_{0.17}Pb(I_{0.6}Br_{0.4})_3$ organic-inorganic perovskite solar cells is demonstrated herein ("FA" refers to formamidinium). Among various methylammonium halides, some embodiments of the present disclosure utilized excess MABr in a non-stoichiometric precursor solution resulting in strong improvements to the final organic-inorganic perovskite crystallographic properties and device characteristics, without affecting the organic-inorganic perovskite composition. In contrast, other examples using excess MAI significantly reduced the bandgap of the final organic-inorganic perovskite due to the replacement of bromine with iodine. Using 40% excess MABr, a single-junction organic-inorganic perovskite solar cell was demonstrated having a stabilized efficiency of 16.4%. In addition, 20.3% a 4-terminal tandem device was demonstrated having a 20.3% stabilized efficiency, using a 14.7% semi-transparent WBG organic-inorganic perovskite top cell and an 18.6% unfiltered (5.6% filtered) Si bottom cell.

As shown herein, the example organic-inorganic perovskite, $FA_{0.83}Cs_{0.17}Pb(I_{0.6}Br_{0.4})_3$, formed from a non-stoichiometric precursor solution having excess MABr demonstrated the highest intensity of main plane peaks in X-ray diffraction pattern (XRD) with the strongest degree of crystal orientation without morphological changes. This suggests that the excess MABr was more effective at healing defects/improving crystallographic properties during the formation of the organic-inorganic perovskite crystals presumably due to the high bromine content, when compared to the use of a precursor solution containing excess MACl. Further, it is confirmed that the use of excess MABr and MACl did not affect the final composition of perovskite, whereas the use of excess MAI in a precursor solution significantly changed the final perovskite composition. The use of the non-stoichiometric MABr precursor solution resulted in an average short-circuit current density ($J_{sc}$) and open-circuit voltage ($V_{oc}$) for the final organic-inorganic perovskite-containing solar cell of increased by about 0.5 mA/cm$^2$ and 60 mV, respectively, resulting in average reverse stabilized efficiency increasing from 13.59±0.43% to 15.72±0.56%. The best organic-inorganic perovskite-containing device reached a stabilized PCE of 16.4%.

FIG. 1 illustrates that organic-inorganic perovskites 100 may organize into cubic crystalline structures, as well as other crystalline structures such as tetragonal and orthorhombic, and may be described by the general formula ABX$_3$, where X (130) is an anion and A (110) and B (120) are cations, typically of different sizes (A typically larger than B). In a cubic unit cell, the B-cation 120 resides at the eight corners of a cube, while the A-cation 110 is located at the center of the cube and is surrounded by six X-anions 130 (located at the face centers) in an octahedral $[BX_6]^{4-}$ cluster (unit structure). Typical inorganic perovskites include calcium titanium oxide (calcium titanate) minerals such as, for example, CaTiO$_3$ and SrTiO$_3$. In some embodiments of the present invention, the A-cation 110 may include a nitrogen-containing organic compound such as an alkyl ammonium compound. The B-cation 120 may include a metal and the X-anion 130 may include a halogen.

Additional examples for the A-cation 110 include organic cations and/or inorganic cations. Organic A-cations 110 may be an alkyl ammonium cation, for example a $C_{1-20}$ alkyl ammonium cation, a $C_{1-6}$ alkyl ammonium cation, a $C_{2-6}$ alkyl ammonium cation, a $C_{1-5}$ alkyl ammonium cation, a $C_{1-4}$ alkyl ammonium cation, a $C_{1-3}$ alkyl ammonium cation, a $C_{1-2}$ alkyl ammonium cation, and/or a $C_1$ alkyl ammonium cation. Further examples of organic A-cations 110 include methylammonium ($CH_3NH^{3+}$), ethylammonium ($CH_3CH_2NH^{3+}$), propylammonium ($CH_3CH_2 CH_2NH^{3+}$), butylammonium ($CH_3CH_2 CH_2 CH_2NH^{3+}$), formamidinium ($NH_2CH=NH^{2+}$), and/or any other suitable nitrogen-containing organic compound. In other examples, an A-cation 110 may include an alkylamine. Thus, an A-cation 110 may include an organic component with one or more amine groups. For example, an A-cation 110 may be an alkyl diamine halide such as formamidinium ($CH(NH_2)_2$). Thus, the A-anion 110 may include an organic constituent in combination with a nitrogen constituent. In some cases, the organic constituent may be an alkyl group such as straight-chain or branched saturated hydrocarbon group having from 1 to 20 carbon atoms. In some embodiments, an alkyl group may have from 1 to 6 carbon atoms. Examples of alkyl groups include methyl ($C_1$), ethyl ($C_2$), n-propyl ($C_3$), iso-propyl ($C_3$), n-butyl ($C_4$), tert-butyl ($C_4$), sec-butyl ($C_4$), iso-butyl ($C_4$), n-pentyl ($C_5$), 3-pentanyl ($C_5$), amyl ($C_5$), neopentyl ($C_5$), 3-methyl-2-butanyl ($C_5$), tertiary amyl ($C_5$), and n-hexyl ($C_6$). Additional examples of alkyl groups include n-heptyl ($C_7$), n-octyl (Cs) and the like. In still further embodiments of the present disclosure, an A-cation 110 may include an inorganic constituent, with examples at least one of a Group I element. In some embodiments of the present disclosure, an A-cation 110 may include at least one of cesium and/or rubidium. In some embodiments, an A-cation 110 may include a benzene ring, such as benzylamine and/or phenethylamine.

Examples of metal B-cations 120 include, for example, lead, tin, germanium, and or any other 2+ valence state metal that can charge-balance the perovskite halide 100. Examples for X-anions 130 include halogens: e.g. fluorine, chlorine, bromine, iodine and/or astatine. In some cases, the perovskite halide may include more than one X-anion 130, for example pairs of halogens; chlorine and iodine, bromine and iodine, and/or any other suitable pairing of halogens. In other cases, the perovskite halide 100 may include two or more halogens of fluorine, chlorine, bromine, iodine, and/or astatine.

Thus, the A-cation 110, the B-cations 120, and X-anion may be selected within the general formula of ABX$_3$ to produce a wide variety of perovskite halides 100, including, for example, methylammonium lead triiodide ($CH_3NH_3PbI_3$), and mixed halide perovskites such as $CH_3NH_3PbI_{3-x}Cl_x$ and $CH_3NH_3PbI_{3-x}Br_x$. Thus, a perovskite halide 100 may have more than one halogen element, where the various halogen elements are present in non-integer quantities; e.g. x is not equal to 1, 2, or 3. In addition, perovskite halides, like other organic-inorganic perovskites, can form three-dimensional (3-D), two-dimensional (2-D), one-dimensional (1-D) or zero-dimensional (0-D) networks, possessing the same unit structure. Referring again to FIG. 1, a perovskite having the basic crystal structure illustrated in FIG. 1, having at least one of a cubic, orthorhombic, and/or tetragonal structure, may have other compositions resulting from the combination of the cations having various valence states in addition to the 2+ state and/or 1+ state of lead and alkyl ammonium cations; e.g. compositions other than $AB^{2+}X_3$ (where A is one or more cations, or for a mixed perovskite where A is two or more cations). Thus, the methods described herein may be utilized to create novel mixed cation materials having the composition of a double perovskite (elpasolites), $A_2B^{1+}B^{3+}X_6$, with an example of such a composition being $Cs_2BiAgCl_6$ and $Cs_2CuBiI_6$. Another example of a composition covered within the scope of the present disclosure is described by $A_2B^{4+}X_6$, for example $Cs_2PbI_6$ and $Cs_2SnI_6$. Yet another example is described by $A_3B_2^{3+}X_9$, for example $Cs_3Sb_2I_9$. For each of these examples, A is one or more cations, or for a mixed perovskite, A is two or more cations.

Thus, the present disclosure relates to methods for producing better performing perovskite materials, having better physical properties, where the method includes the use of at least one an additive alkylammonium halide in excess of the theoretical stoichiometric amounts needed to attain a targeted final perovskite composition. For perovskites having the general formula ABX$_3$, the additive may be included in a starting solution that includes at least a first precursor AX at a first concentration $C_1$, a second precursor A'X at a second concentration $C_2$, and a third precursor $BX_2$ at a third concentration $C_3$, where each of $C_1$, $C_2$, and $C_3$ are between 0.001 M and 100 M, or between 0.001 M and 10 M, and the combination of $C_1$, $C_2$, and $C_3$ result in a targeted perovskite composition defined by $A_xA'_{1-x}BX_3$, where $0<x<1$, and $W*C_1=x$, $W*C_2=1-x$, $W*C_3=1.0$, and $W*(C_1+C_2+2*C_3)=3$, where $0.01<W<1000$. W is a scaling factor having units of inverse concentration (e.g. 1/M, 1/mol/L, L/mol). The additive may include at least one of AX, A'X, and/or A"X at a concentration $C_4$, where at least one of $C_4/C_1$, $C_4/C_2$, and/or $C_4/C_4$ is between greater than zero and ten, or between greater than zero and one, and where the additive does not affect the target composition $A_xA'_{1-x}BX_3$ or the resultant bandgap of the target composition $A_xA'_{1-x}BX_3$. Instead, the additive improves at least one physical property and/or performance metric of the target composition $A_xA'_{1-x}BX_3$, for example at least one of an improved Tauc plot, an improved current density versus voltage plot, reduced hysteresis, and/or an improved external quantum efficiency (EQE), when the perovskite is used in a solar cell. Similar mixed A-cation perovskites may be produced according to the methods described herein, where the perovskites have the general formula of at least one of $(A_xA'_{1-x})_2B^{1+}B^{3+}X_6$, $(A_xA'_{1-x})_2B^{4+}X_6$, and/or $(A_xA'_{1-x}a)_3B_2^{3+}X_9$, where an additive is provided in addition to the stoichiometric amounts of the precursors needed to provide the targeted perovskite composition, where the additive does not affect the target composition or its bandgap.

In some embodiments of the present disclosure, for perovskites having the general formula $ABX_3$, the additive may be included in a starting solution that includes at least a first precursor AX at a first concentration $C_1$, a second precursor A'X at a second concentration $C_2$, a third precursor $BX_2$ at a third concentration $C_3$, and a fourth precursor $BX'_2$ at a fourth concentration $C_4$, where each of $C_1$, $C_2$, $C_3$, and $C_4$ are between 0.001 M and 100 M, or between 0.001 M and 10 M, and the combination of $C_1$, $C_2$, $C_3$, and $C_4$ result in a targeted perovskite composition defined by $A_xA'_{1-x}B(X_yX_{1-y})_3$, where $0\le x\le 1$, and $0\le y\le 1$, and where $W*C_1=x$, $W*C_2=1-x$, $W*2*C_3=y$, $W*2*C_4=1-y$, $W*(C_1+C_2+2*C_3+2*C_4)=3$, and $W*(C_3+C_4)=1.0$, where $0.01\le W\le 1000$. The additive may include at least one of AX, A'X, and/or A"X, at a concentration $C_5$, where at least one of $C_5/C_1$, $C_5/C_2$, and/or $C_5/C_5$ is between greater than zero and ten, or between greater than zero and one, and where the additive does not affect the target composition $A_xA'_{1-x}B(X_yX'_{1-y})_3$ or the resultant bandgap of the target composition $A_xA'_{1-x}B(X_yX'_{1-y})_3$. Instead, the additive improves at least one physical property and/or performance metric of the target composition $A_xA'_{1-x}B(X_yX'_{1-y})_3$, for example at least one of an improved Tauc plot, an improved current density versus voltage plot, reduced hysteresis, and/or an improved external quantum efficiency (EQE), when the perovskite is used in a solar cell. Similar mixed A-cation, mixed B-cation, and/or mixed anion perovskites may be produced according to the methods described herein, where the perovskites have the general formula of at least one of $(A_xA'_{1-x})_2B^{1+}B^{3+}(X_yX'_{1-y})_6$, $(A_xA'_{1-x})_2B^{4++}(X_yX'_{1-y})_6$, and/or $(A_xA'_{1-x})_3B_2^{3++}(X_yX'_{1-y})_9$, where an additive is provided in addition to the stoichiometric amounts of the precursors needed to provide the targeted perovskite composition, where the additive does not affect the target composition or its bandgap.

Similarly, for perovskites having the general formula $ABX_3$, perovskites having the formula $A_xA'_yA''_{(1-x-y)}B(X_aX'_bX''_{(1-a-b)})_3$ may be produced using methods described herein, where x, y, a, and b are each greater than or equal to zero and less than or equal to one. For this example, the additive may be included in a starting solution that includes at least a first precursor AX at a first concentration $C_1$, a second precursor A'X at a second concentration $C_2$, a third precursor A"X at a third concentration $C_3$, a fourth precursor $BX_2$ at a fourth concentration $C_4$, a fifth precursor $BX'_2$ at a fifth concentration $C_5$, a sixth precursor $BX''_2$ at a sixth concentration $C_6$, where each of $C_1$, $C_2$, $C_3$, $C_4$, $C_5$, and $C_6$ are between 0.001 M and 100 M, or between 0.001 M and 10 M, and the combination of $C_1$, $C_2$, $C_3$, $C_4$, $C_5$, and $C_6$ result in a targeted perovskite composition defined by $A_xA'_yA''_{(1-x-y)}B(X_aX'_bX''_{(1-a-b)})_3$, where $W*C_1=x$, $W*C_2=y$, $W*C_3=1-x-y$, $W*2*C_4=a$, $W*2*C_5=b$, $W*2*C_6=1-a-b$, $W*(C_1+C_2+C_3+2*C_4+2*C_5+2*C_6)=3.0$, and $W*(C_4+C_5+C_6)=1.0$, where $0.01\le W\le 1000$. The additive may include at least one of AX, A'X, A"X, and or A'"X at a concentration $C_7$, where at least one of $C_7/C_1$, $C_7/C_2$, $C_7/C_3$, and/or $C_7/C_7$ is between greater than zero and ten, or between greater than zero and one, and where the additive does not affect the composition $A_xA'_yA''_{(1-x-y)}B(X_aX'_bX''_{(1-a-b)})_3$ or the resultant bandgap of the composition $A_xA'_yA''_{(1-x-y)}B(X_aX'_bX''_{(1-a-b)})_3$. Instead, the additive improves at least one physical property and/or performance metric of the target composition $A_xA'_yA''_{(1-x-y)}B(X_aX'_bX''_{(1-a-b)})_3$, for example at least one of an improved Tauc plot, an improved current density versus voltage plot, reduced hysteresis, and/or an improved external quantum efficiency (EQE), when the perovskite is used in a solar cell. Similar mixed A-cation, and/or mixed anion perovskites may be produced according to the methods described herein, where the perovskites have the general formula of at least one of $(A_xA'_yA''_{(1-x-y)})_2B^{1+}X'_bX^{3+}(X_aX'_bX''_{(1-a-b)})_6$, $(A_xA'_yA''_{(1-x-y)})_2B^{4++}(X_aX'_bX''_{(1-a-b)})_6$, and/or $(A_xA'_yA''_{(1-x-y)})_3B_2^{3++}(X_aX'_bX''_{(1-a-b)})_9$, where an additive is provided in addition to the stoichiometric amounts of the precursors needed to provide the targeted perovskite composition, where the additive does not affect the target composition or its bandgap.

Further, the present disclosure relates to methods for producing better performing perovskite materials having the general composition $ABX_3$, having better physical properties, where the method includes the use of at least one an additive alkylammonium halide in excess of the theoretical stoichiometric amounts needed to attain a targeted final perovskite composition. The additive may be included in a starting solution that includes at least a first precursor AX at a first concentration $C_1$, a second precursor A'X at a second concentration $C_2$, a third precursor $BX_2$ at a third concentration $C_3$, and a fourth precursor $B'X_2$ at a fourth concentration $C_4$, where each of $C_1$, $C_2$, $C_3$, and $C_4$ are between 0.001 M and 100 M, or between 0.001 M and 10 M, and the combination of $C_1$, $C_2$, $C_3$, and $C_4$ result in a targeted perovskite composition defined by $A_xA'_{1-x}B_yB'_{1-y}X_3$, where $0\le x\le 1$ and $0\le y\le 1$, and $W*C_1=x$, $W*C_2=1-x$, $W*C_3=y$, $W*C_4=1-y$, and $W*(C_1+C_2+2*C_3+2*C_4)=3$, where $0.01\le W\le 1000$. The additive may include at least one of AX, A'X, and/or A"X at a concentration $C_4$, where at least one of $C_4/C_1$, $C_4/C_2$, and/or $C_4/C_4$ is between greater than zero and ten, or between greater than zero and one, and where the additive does not affect the target composition $A_xA'_{1-x}BX_3$ or the resultant bandgap of the target composition $A_xA'_{1-x}BX_3$. Instead, the additive improves at least one physical property and/or performance metric of the target composition $A_xA'_{1-x}BX_3$, for example at least one of an improved Tauc plot, an improved current density versus voltage plot, reduced hysteresis, and/or an improved external quantum efficiency (EQE), when the perovskite is used in a solar cell.

Similar mixed A-cation and/or mixed B-cation perovskites may be produced according to the methods described herein, where the perovskites have the general formula of at least one of $(A_xA'_{1-x}a)_2(B_aB'_{1-a})^{1+}B''^{3+}X_6$, $(A_xA'_{1-x})_2(B_aB'_{1-a})^{3+}B'''^{1+}X_6$, $(A_xA'_{1-x}a)_2(B_aB'_{1-a})^{4++}X_6$, and/or $(A_xA'_{1-x})_3(B_aB'_{1-a})_2{}^{3++}X_9$, where additive is provided in addition to the stoichiometric amounts of the precursors needed to provide the targeted perovskite composition, where the additive does not affect the target composition or its bandgap.

Further, the present disclosure relates to methods for producing better performing perovskite materials, having better physical properties, where the method includes the use of at least one an additive alkylammonium halide in excess of the theoretical stoichiometric amounts needed to attain a targeted final perovskite composition. The additive may be included in a starting solution that includes at least a first precursor AX at a first concentration $C_1$, a second precursor A'X at a second concentration $C_2$, a third precursor BX at a third concentration $C_3$, and a fourth precursor B'X' at a fourth concentration $C_4$, where each of $C_1$, $C_2$, $C_3$, and $C_4$ are between 0.001 M and 100 M, or between 0.001 M and 10 M, and the combination of $C_1$, $C_2$, $C_3$, and $C_4$ result in a targeted perovskite composition defined by $A_xA'_{1-x}B_yB'_{1-y}(X_zX'_{1-z})_3$, where $0 \leq x \leq 1$, $0 \leq y \leq 1$, and $0 \leq z \leq 1$. In some embodiments of the present disclosure, $W*C_1=x$, $W*C_2=1-x$, $W*C_3=y$, $W*C_4=1-y$, and $W*(C_1+C_2+C_3+C_4)=3$, where $0.01 \leq W \leq 1000$. The additive may include at least one of AX, A'X, and/or A"X at a concentration $C_4$, where at least one of $C_4/C_1$, $C_4/C_2$, and/or $C_4/C_4$ is between greater than zero and ten, or between greater than zero and one, and where the additive does not affect the target composition $A_xA'_{1-x}B_yB'_{1-y}(X_zX'_{1-z})_3$ or the resultant bandgap of the target composition $A_xA'_{1-x}B_yB'_{1-y}(X_zV_{1-z})_3$. Instead, the additive improves at least one physical property and/or performance metric of the target composition $A_xA'_{1-x}BX_3$, for example at least one of an improved Tauc plot, an improved current density versus voltage plot, reduced hysteresis, and/or an improved external quantum efficiency (EQE), when the perovskite is used in a solar cell. Similar mixed A-cation, mixed B-cation, and/or mixed anion perovskites may be produced according to the methods described herein, where the perovskites have the general formula of at least one of $(A_xA'_{1-x})_2(B_aB'_{1-a})^{1+}B''^{3+}(X_bX'_{b-1})_6$, $(A_xA'_{1-x})_2(B_aB'_{1-a})^{3+}B'''^{1+}(X_bX'_{b-1})_6$, $(A_xA'_{1-x})_2(B_aB'_{1-a})^{4++}(X_bX'_{b-1})_6$, and/or $(A_xA'_{1-x})_3(B_aB'_{1-a})_2{}^{3++}(X_bX'_{b-1})_9$, where an additive is provided in addition to the stoichiometric amounts of the precursors needed to provide the targeted perovskite composition, where the additive does not affect the target composition or its bandgap.

Further, in some embodiments of the present disclosure, the perovskite may be positioned on at least one of a silicon substrate, a CIGS substrate, a CdTe substrate, a III-V alloy, another substrate made of another perovskite material, and/or any other suitable substrate having a bandgap between 0.9 eV and 1.5 eV, inclusively. In some embodiments of the present disclosure, the final target perovskite may include $FA_xCs_{1-x}Pb(I_yBr_zCl_{(1-y-z)})_3$, where x, y, and z are all between greater than zero and less than or equal to one. In some embodiments of the present disclosure, the final target perovskite may include $FA_{0.83}Cs_{0.17}Pb(I_{0.6}Br_{0.4})_3$. For any of the above described perovskite materials, produced by the methods described herein, may have a relatively wide bandgap; e.g. greater than or equal to 1.6 eV, or between 1.6 eV and 2.5 eV, inclusively. However, depending on the specifics of the fabrication method, perovskite materials having a relatively low bandgap may also be produced; e.g. less than or equal to 1.5 eV, or between 1.2 eV and 1.5 eV, inclusively.

Figure 2:
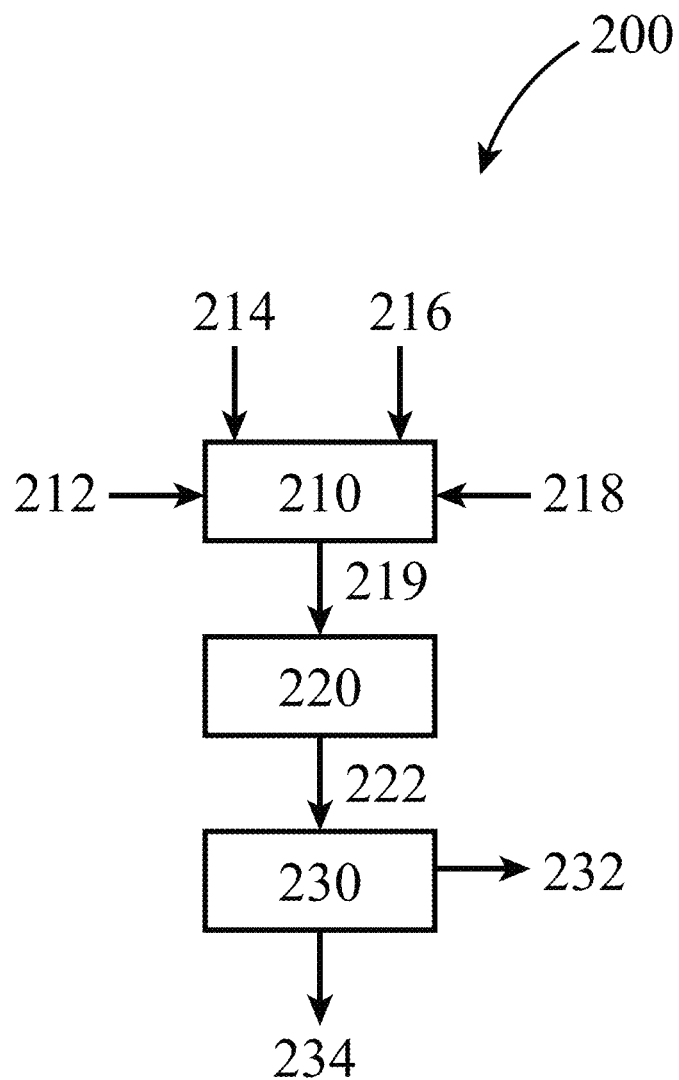
FIG. 2 illustrates a method for producing an organic-inorganic perovskite, according to some embodiments of the present disclosure.

FIG. 2 illustrates a method 200 for producing an organic-inorganic perovskite layer 234, according to some embodiments of the present disclosure. The method 200 may begin with the combining 210 of various precursors, for example a first precursor 212, a second precursor 214, up to a predetermined number, n, of precursors, thus including an $n^{th}$ precursor 216. Each of these precursors (212, 214, and 216) may provide one or more of the compounds and/or elements required to achieve the final targeted organic-inorganic perovskite composition, e.g. $FA_{0.83}Cs_{0.17}Pb(I_{0.6}Br_{0.4})_3$. Thus, for this particular example, the first precursor 212 may include CsI, the second precursor 214 may include formamidinium iodide (FAI), a third precursor (not shown) may include $PbBr_2$, and an $n^{th}$ precursor 216 for n equal to four may include $PbI_2$. Again for the specific example of an organic-inorganic perovskite defined by $FA_{0.83}Cs_{0.17}Pb(I_{0.6}Br_{0.4})_3$, this final composition may be achieved by combining 210 the desired stoichiometric amounts of each of the first precursor 212 of CsI, the second precursor 214 of FAI, the third precursor (not shown) of $PbBr_2$, and the fourth (n=4) precursor 216 of $PbI_2$ to form a precursor solution 219 having molar concentrations of 0.17 M, 0.83 M, 0.6 M, and 0.4 for each of the four precursors, respectively. In addition, the combining 210 may include an additive 218, which provides an excess (e.g. above the stoichiometric amount) of at least one of element and/or constituents making up the final composition of the organic-inorganic perovskite layer 234. For example, for the case of $FA_{0.83}Cs_{0.17}Pb(I_{0.6}Br_{0.4})_3$, the additive 218 may include at least one of MAI, MABr, and/or MACl at a molar concentration between 0.01 M and 1.0 M. The precursor solution 210 may be formed using any suitable solvent, with examples including water and/or organic solvents (not shown). However, this composition is provided for exemplary purposes and other compositions for organic-inorganic perovskites are within the scope of the present disclosure. For example, compositions defined by $FA_xCs_{1-x}Pb(I_yBr_{1-y})_3$, where $0 \leq x \leq 1$ and $0 \leq y \leq 1$, may be produced according to some of the embodiments described herein. More generally, $A_xA'_{1-x}B(X_yX'_{1-y})_3$, where A and A' are both A-cations, X and X' are both anions, and B is a cation as described above, $0 \leq x \leq 1$, and $0 \leq y \leq 1$, may be produced according to some of the embodiments described herein. Similarly, perovskites having the general formula $A_xA'_yA''_{(1-x-y)}B(X_aX'_bX''_{(1-a-b)})_3$ may also be produced using methods described herein, where each of x, y, a, and b are greater than or equal to zero and less than or equal to one.

The method 200 may then continue by applying 220 the precursor solution 219 to a substrate (not shown), for example by spin-coating, dip-coating, curtain-coating, blade-coating, and/or any other suitable solution-processing method, resulting in the formation of a liquid film 222. After the liquid film 222 has been formed, the method 200 may proceed with treating 230 the liquid film 222, resulting in the removal of volatiles 232 (e.g. water and/or organic solvents) to form the final organic-inorganic perovskite layer 234. For example, the treating 230 may include thermal treating, where the liquid film 222 is heated to a temperature of up to 100° C. to remove the volatiles 232. Further, the treating 230 may include exposing the liquid film 222 to a local pressure that is less than one atmosphere; e.g. a vacuum. In addition, the treating 230 may be performed for a period of time between one minute and one hour. In some embodiments of the present disclosure, the treating 230 may include exposing the liquid film 22 to a gas stream such as nitrogen and/or dry air.

Figure 3A:
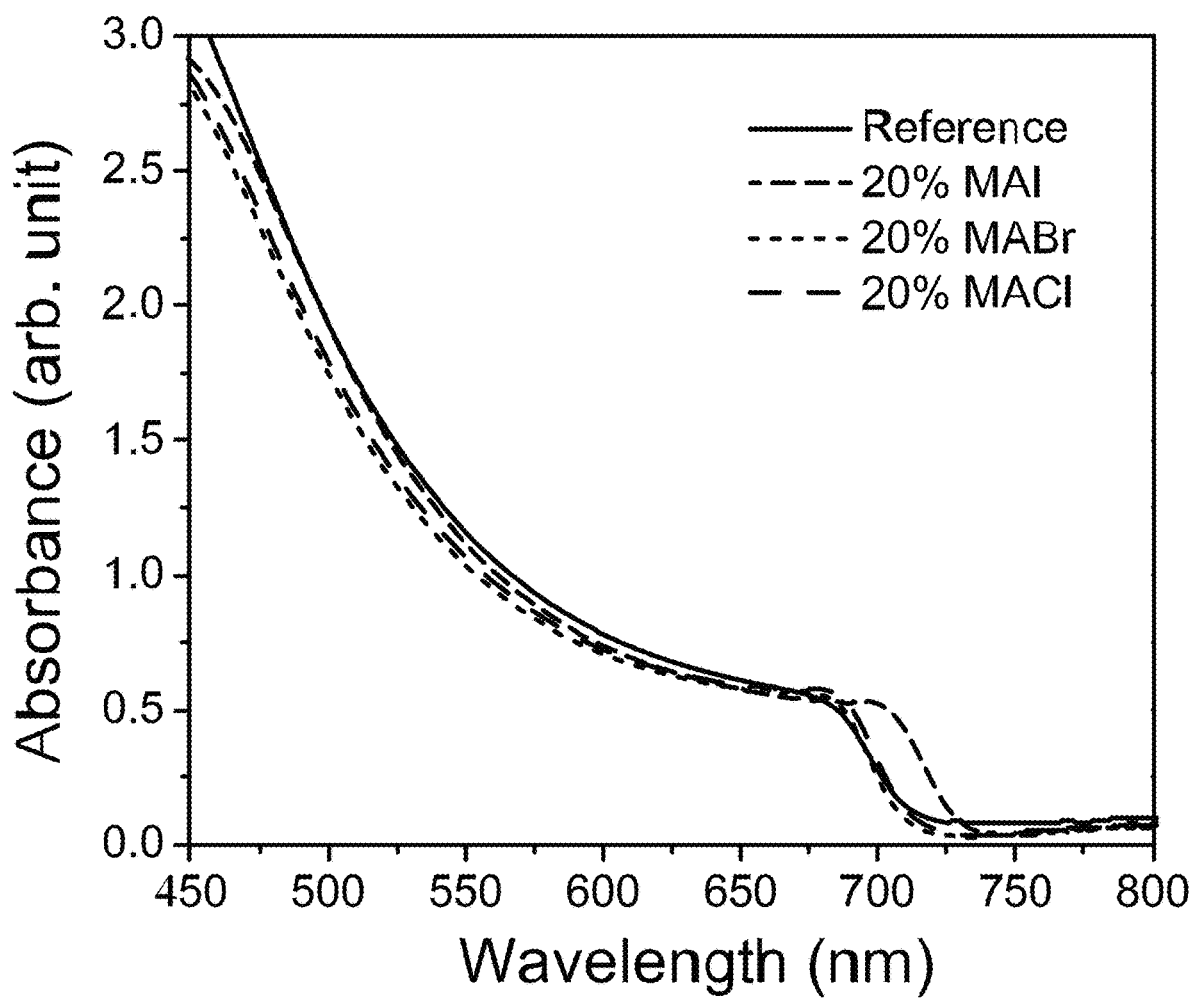
FIG. 3A illustrates UV-vis absorption of organic-inorganic perovskite films prepared from precursors with and without excess methylammonium halides as indicated, according to some embodiments of the present disclosure.
Figure 3B:
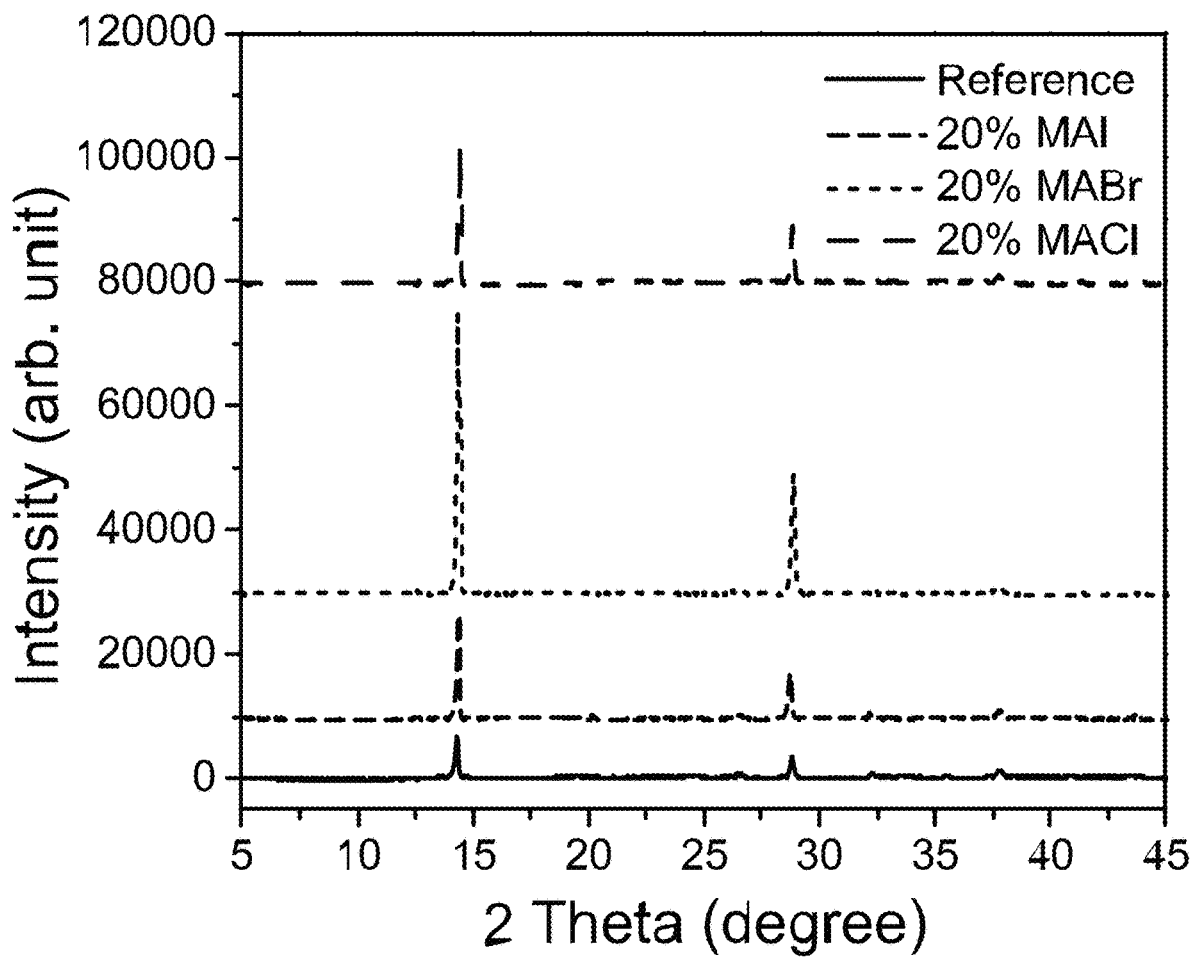
FIG. 3B illustrates x-ray diffraction (XRD) patterns of organic-inorganic perovskite films prepared from precursors with and without excess methylammonium halides as indicated, according to some embodiments of the present disclosure.
Figure 4:
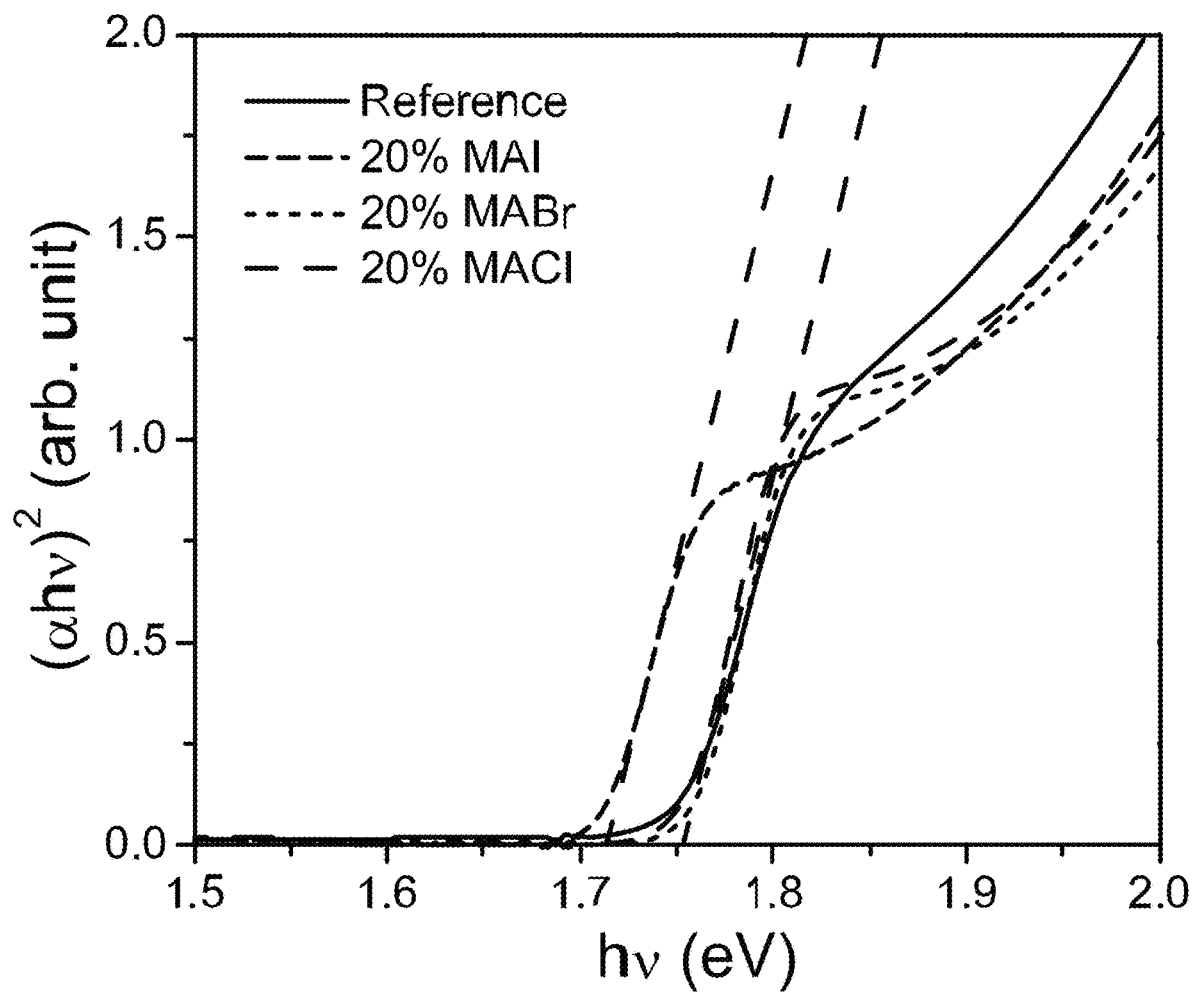
FIG. 4 illustrates Tauc plots of organic-inorganic perovskite films prepared from precursors with and without excess methylammonium halide additives, according to some embodiments of the present disclosure. When 20% methylammonium bromide (MABr) or methylammonium chloride (MACl) additive was used, the bandgap stayed unchanged at about 1.752 eV. When 20% methylammonium iodide (MAI) additive was used, the bandgap was reduced to about 1.715 eV.
Figure 5A:
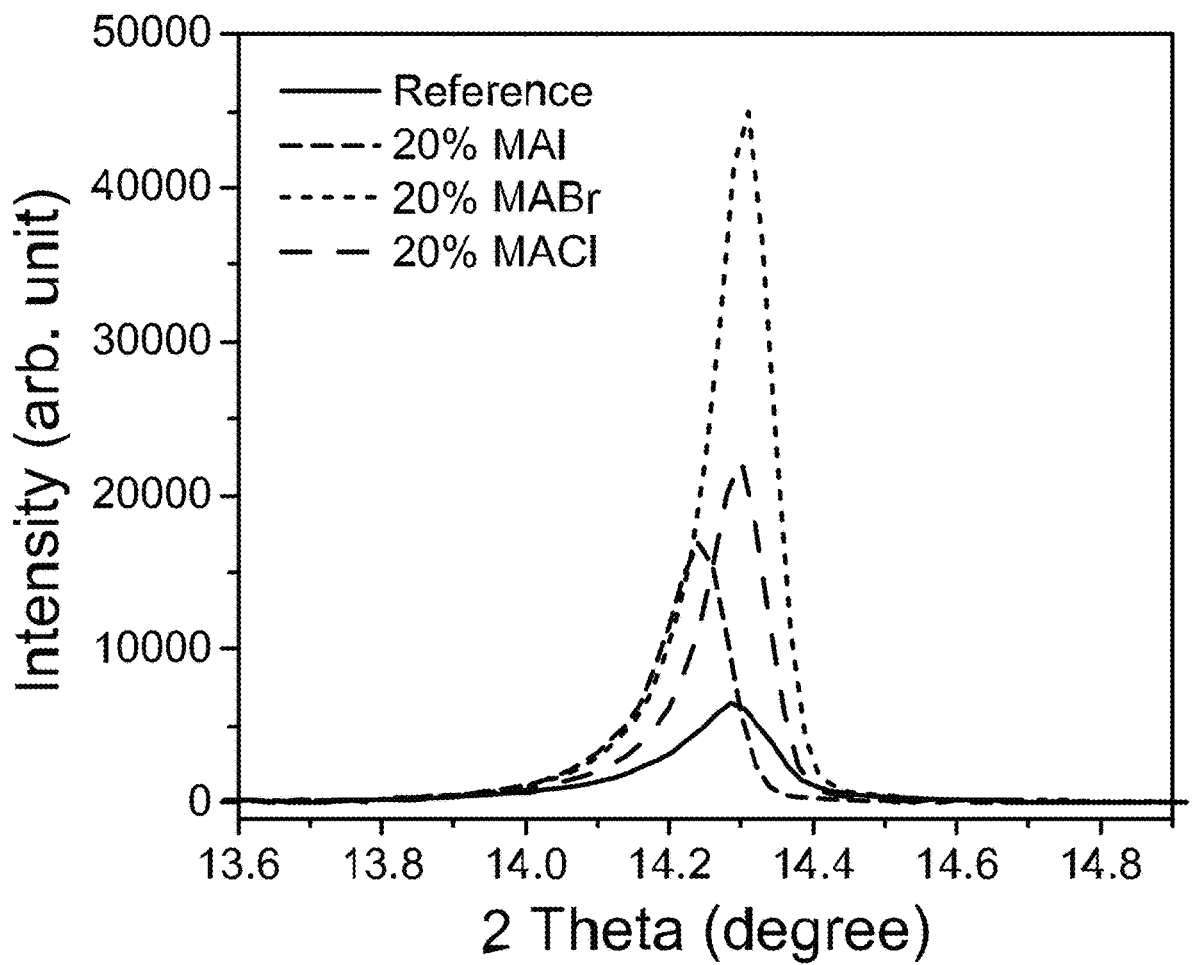
FIG. 5A illustrates the effect of non-stoichiometric precursor with excess 20% MAI, MABr, or MACl additives on the XRD patterns, the (100) peaks, of the resultant organic-inorganic perovskite layers produced, according to some embodiments of the present disclosure.
Figure 5B:
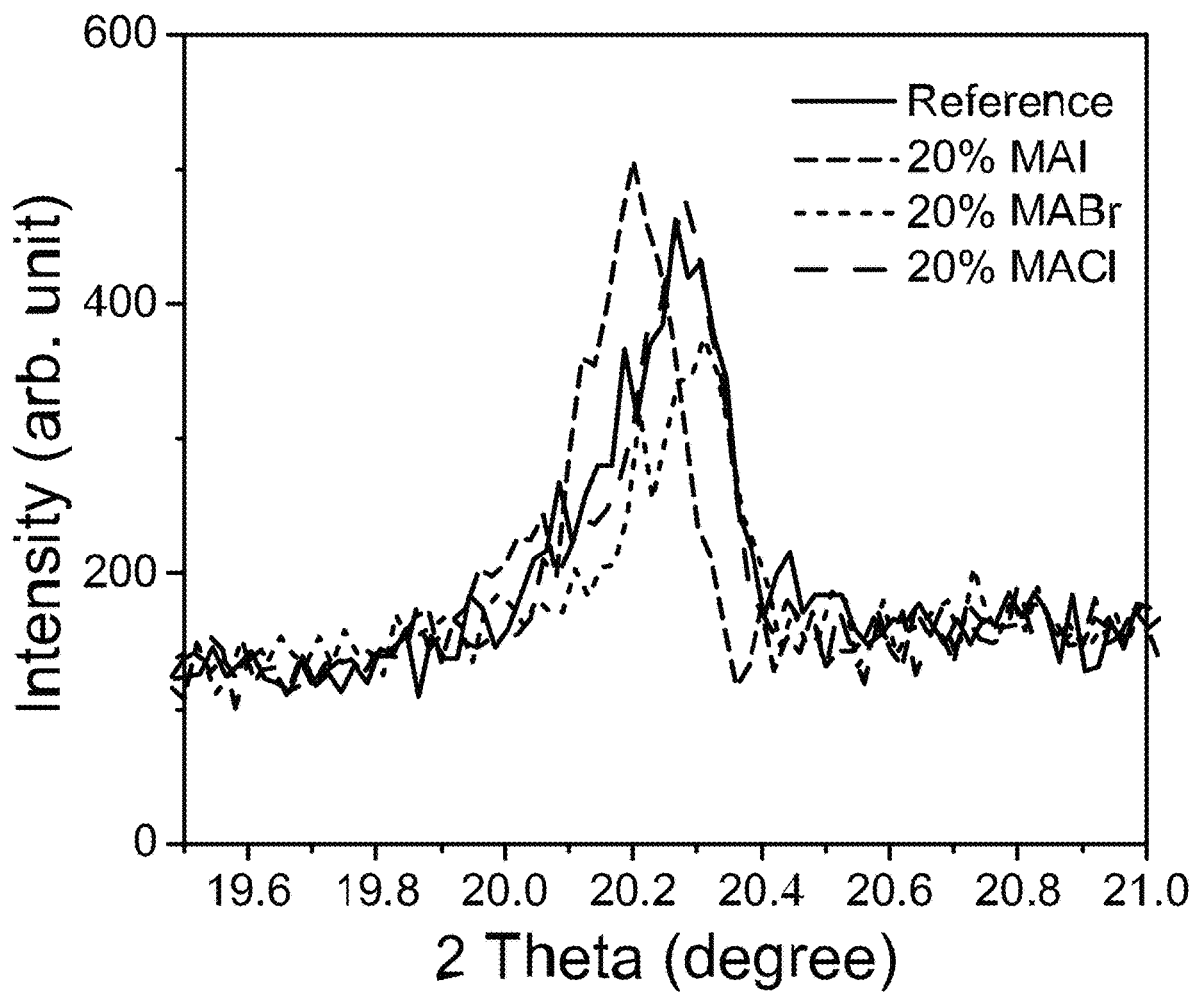
FIG. 5B illustrates the effect of non-stoichiometric precursor with excess 20% MAI, MABr, or MACl additives on the XRD patterns, the (110) peaks, of the resultant organic-inorganic perovskite layers produced, according to some embodiments of the present disclosure.

FIG. 3A illustrates the UV-vis absorption spectrum for organic-inorganic perovskite films prepared with and without the use of excess of methylammonium halides in the precursor solution. For this example, the pristine organic-inorganic perovskite sample $(FA_{0.83}Cs_{0.17}Pb(I_{0.6}Br_{0.4})_3)$, which was prepared according to the procedure described below, used a stoichiometric perovskite precursor consisting of 0.17M CsI, 0.83 M FAI, 0.6 M $PbBr_2$, 0.4 M $PbI_2$ in DMF solution with HI and HBr acid additives, exhibited the absorption spectrum corresponding to an optical bandgap of 1.752 eV. The absorption spectra were barely affected using 20% excess of MABr or MACl additives in the precursor solution, suggesting that the perovskite structure was not altered. This suggests that non-stoichiometric solution strategies having excess methylammonium halides may be used to improve the characteristics and/or properties of organic-inorganic mixed-halide (e.g. bromine and iodine) perovskites. In contrast, the use of 20% of MAI additive, resulted in a significant red shift of the absorption onset by about 20 nm. Tauc plots in FIG. 4 further confirm the decrease of the optical bandgap of the organic-inorganic perovskite materials from 1.752 eV (for the reference and MABr/MACl samples) to 1.715 eV when 20% MAI additive was used. The degree of bandgap shift (~0.037 eV) is consistent with the incorporation of about additional 0.2 iodide per 3 halides (I and Br). The X-ray diffraction (XRD) patterns in FIG. 3B and FIGS. 5A and 5B also agreed with the bandgap change as reflected from the UV-vis spectra. The main peak position of the sample produced using excess MAI additive shifted slightly to a lower diffraction angle by about 0.05°. These results suggest that when excess MAI is used as an additive in the precursor solution to produce Br—I (e.g. $(X)'_{1-y})_3$) mixed perovskite materials, the iodide ion may be more stable in the lattice than the bromide ion. Consequently, the final amount of iodide ion in I—Br mixed-halide organic-inorganic perovskite was increased depending on the amount of iodide ion in the precursor solution. In contrast, the excess bromide (or chloride) resulting from the MABr additive (or the MACl additive) was less stable than iodide when competing for the lattice sites, and consequently, the final bandgap of the resultant organic-inorganic perovskite prepared using excess MABr or MACl additives was not affected by the removal of the bromine and iodine during the subsequent treating, e.g. annealing. This is important for developing alloyed perovskite samples (especially for WBG organic-inorganic perovskite materials having a high bromine content) since the bandgap may be easily affected by halide-based precursor precursors and/or additives.

It is noteworthy that the intensity of the main organic-inorganic perovskite (100) peak was enhanced with the use of excess methylammonium halides additives, especially for the MABr additive, which leads to an order of magnitude increase in the peak intensity. In comparison to the use of the MACl additive, the MABr additive presumably reduces to a lesser degree the perovskite lattice structure with a bromide rich condition during the transition from a precursor state to the intermediate phase, and ultimately to the final organic-inorganic perovskite crystal structure. In addition, the chlorine in the MACl additive could form a relatively stable Br—Cl alloy state during the intermediate film formation stage. The enhanced XRD peak intensity is normally associated with higher crystallinity and/or more aligned grain orientation (texture). The full-width half-maximum (FWHM) of the (100) plane decreased from 0.153° for the reference sample, to 0.117° with 20% MAI additive in the precursor solution, 0.105° with 20% MACl additive, and 0.099° for 20% MABr additive (see FIG. 5A and Table 1).

In general, the sharp XRD peak with small FWHM means high crystallinity, increased crystal size, and decreased bulk defect. Thus, the organic-inorganic perovskite prepared from non-stoichiometric precursor, e.g. containing excess MABr additive, showed the most improved crystallographic properties in comparison to using other excess halide-containing additives. The degree of grain orientation is another parameter that shows the crystallographic properties of polycrystalline thin films. Through determining the intensity ratio of peaks for the (100) plane to the (110) plane (see Table 1), the degree of orientation was qualitively assessed. The (100)/(110) intensity ratio increased from about 20 for the pristine organic-inorganic perovskite film using stoichiometric amounts of precursors to 181 for the film prepared using excess MABr additive in the precursor solution.

TABLE 1

Effect of non-stoichiometric precursor with excess 20% MAI, MABr, or MACl on the (100) and (110) XRD peak intensity, full-width half-maximum (FWHM) of (100) planes, and (100)/(110) peak intensity ratio.

| | (100) ~14.3° | (100) FWHM | (110) ~20.3° | (100)/(110) ratio |
|---|---|---|---|---|
| Reference | 6653 | 0.153 | 333 | 20 |
| 20% MAI | 16916 | 0.117 | 378 | 45 |
| 20% MABr | 44948 | 0.099 | 247 | 182 |
| 20% MACl | 22305 | 0.105 | 350 | 64 |

Figure 6:
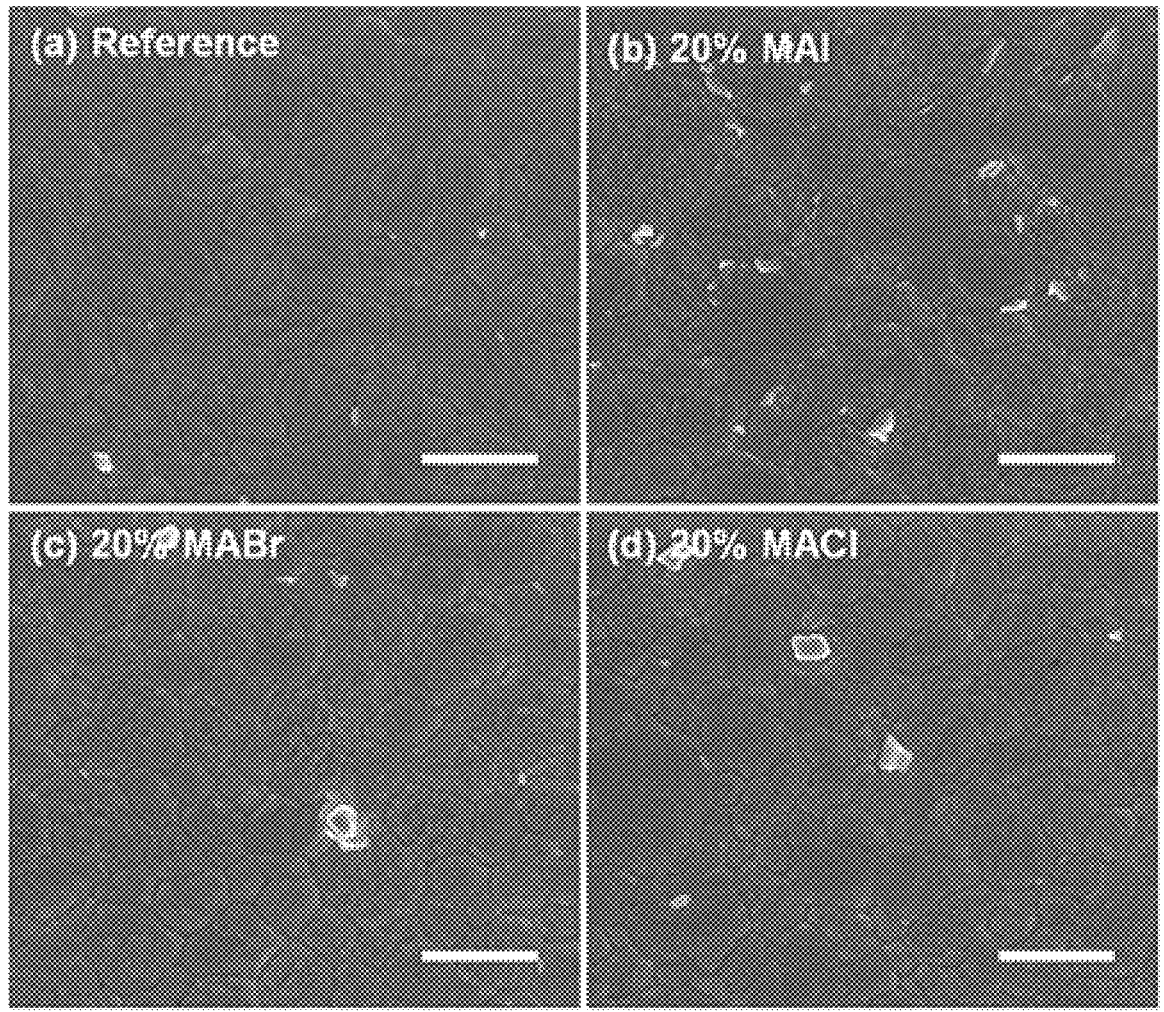
FIG. 6 illustrates the morphology of organic-inorganic perovskite films prepared from precursors with and without excess methylammonium halide additives, according to some embodiments of the present disclosure: Panel (a) no additive; Panel (b) 20% MAI; Panel (c) 20% MABr; and Panel (d) 20% MACl (scale bae is 1 μm).

FIG. 6 shows a top view of SEM images of organic-inorganic perovskite films prepared with and without the use of excess methylammonium halide additives (20% MAI, MABr, or MACl), according to some embodiments of the present disclosure. Analysis of these images shows that the average grain size was about 1.2±0.6 μm for all these films. There is no clearly discernable difference in the average grain size among these films. This could be caused by the use of an acid additive (e.g., HI or HBr) in the precursor chemistry (not shown in FIG. 2). It is often found that larger grain size leads to improved carrier lifetime, higher carrier mobility, and improved device characteristics. This is frequently attributed to the reduction of the number of grain boundaries. However, the larger grain size is also frequently connected to enhanced film crystallinity and preferred orientation, which also affect device performance.

Figure 7:
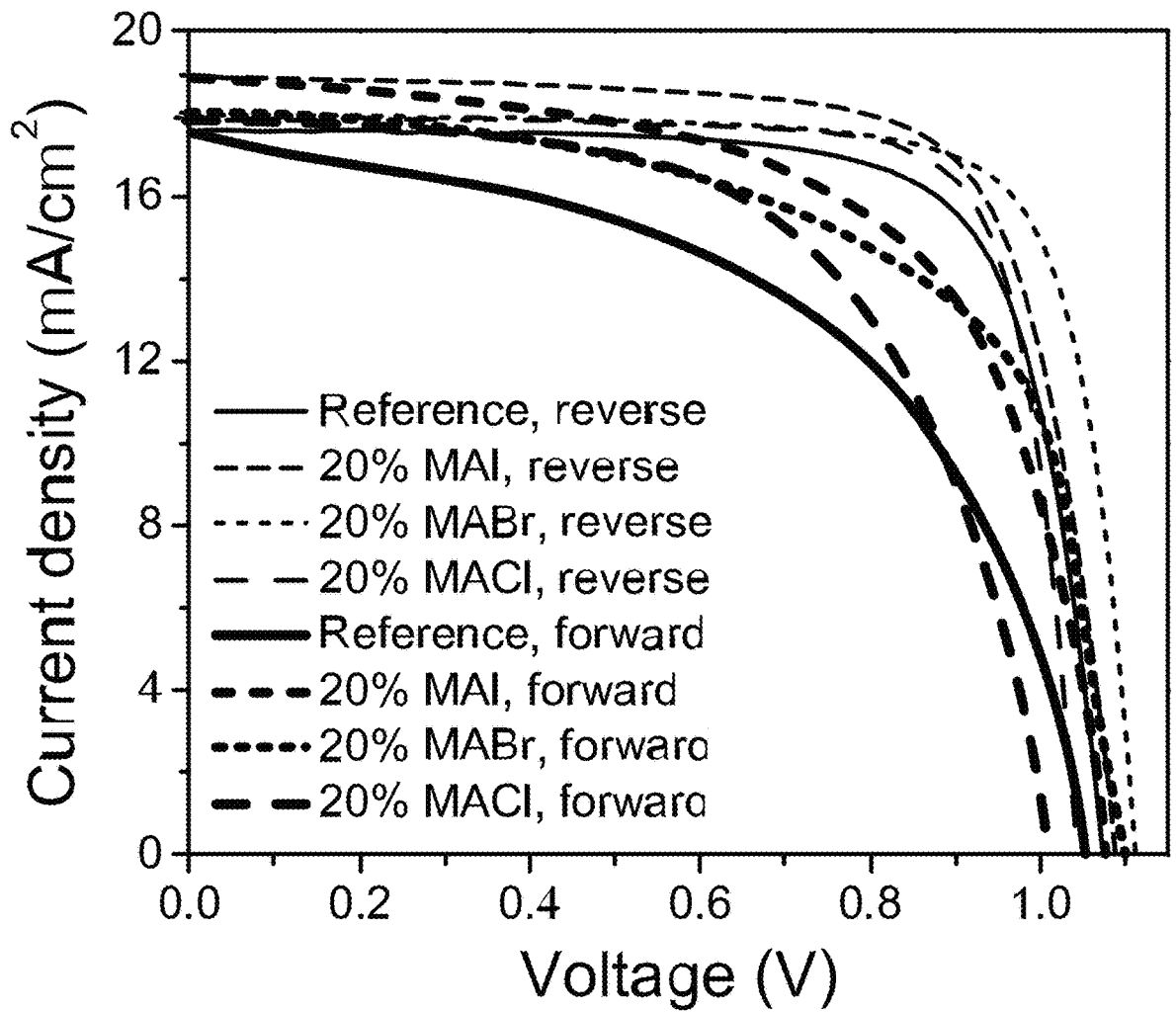
FIG. 7 illustrates the effect of stoichiometric precursors having an excess of methylammonium halide additives on J-V characteristics, according to some embodiments of the present disclosure. 20% of MAI, MABr or MACl additives were added to the standard stoichiometric precursor. Both reverse and forward scans are shown.

FIG. 7 shows the typical photocurrent density-voltage (J-V) curves for perovskite solar cells (PSCs) using organic-inorganic perovskite films prepared with and without the use of excess methylammonium halide additives (20% MAI, MABr, or MACl), according to some embodiments of the present disclosure. When the MAI additive was used, the $J_{sc}$ was clearly higher than that of the other devices. This is consistent with the reduced bandgap as we discussed above in connection with the absorption spectra shown Panel (a) of FIG. 3 and FIG. 4. Because of the minimum impact to the bandgap when 20% MABr or MACl additive was used, the $J_{sc}$ values of these devices are essentially the same as the reference device. Regardless which methylammonium halide additive was used, the device hysteresis was clearly reduced. This can be attributed to the improved crystallographic properties as discussed in connection with FIG. 3B and FIG. 5B. The details of the PV parameters including $J_{sc}$, $V_{oc}$, fill factor (FF), and power conversion efficiency (PCE) are summarized in Table 2. Based on these results, it is clear that the MABr additive had the strongest positive effect on the final device performance, especially the $V_{oc}$, without changing the organic-inorganic perovskite composition (and bandgap). This is consistent with the structure effect as discussed above. It should be noted that the use of excess MAI additive can also significantly improve device performance and reduce hysteresis, but at a cost of shifting the bandgap from 1.752 to 1.715 eV.

TABLE 2

Effect of non-stoichiometric precursor with excess methylammonium halides on the statistics of PV parameters of WGB PSCs.

|  |  | $J_{sc}$ (mA/cm$^2$) | $V_{oc}$ (V) | FF | PCE (%) |
|---|---|---|---|---|---|
| Reference | reverse | 17.47 ± 0.26 | 1.071 ± 0.007 | 0.726 ± 0.021 | 13.59 ± 0.43 |
|  | forward | 17.39 ± 0.32 | 1.047 ± 0.006 | 0.505 ± 0.024 | 9.20 ± 0.54 |
| 20% MAI | reverse | 18.88 ± 0.12 | 1.085 ± 0.005 | 0.727 ± 0.021 | 14.90 ± 0.45 |
|  | forward | 18.88 ± 0.12 | 1.067 ± 0.020 | 0.616 ± 0.027 | 12.40 ± 0.71 |
| 20% MABr | reverse | 17.87 ± 0.18 | 1.102 ± 0.013 | 0.765 ± 0.024 | 15.08 ± 0.60 |
|  | forward | 18.01 ± 0.10 | 1.092 ± 0.017 | 0.570 ± 0.053 | 11.20 ± 0.92 |
| 20% MACl | reverse | 17.81 ± 0.18 | 1.064 ± 0.036 | 0.779 ± 0.016 | 14.76 ± 0.28 |
|  | forward | 17.84 ± 0.19 | 1.028 ± 0.046 | 0.590 ± 0.031 | 10.83 ± 0.86 |

Figure 8A:
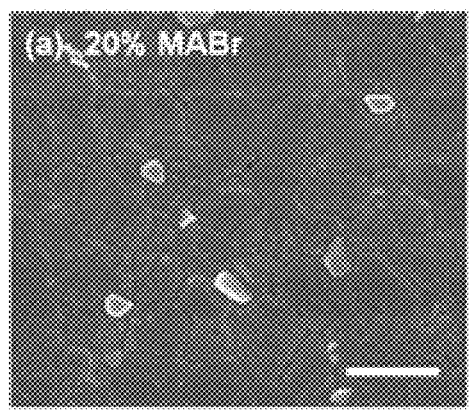
FIGS. 8A, 8B, and 8C illustrate SEM images of perovskite films prepared with 20%, 40%, and 80% MABr, respectively (scale bae is 1 μm) and show the effect of the MABr concentration additive on the final organic-inorganic perovskite films produced, according to some embodiments of the present disclosure
Figure 8B:
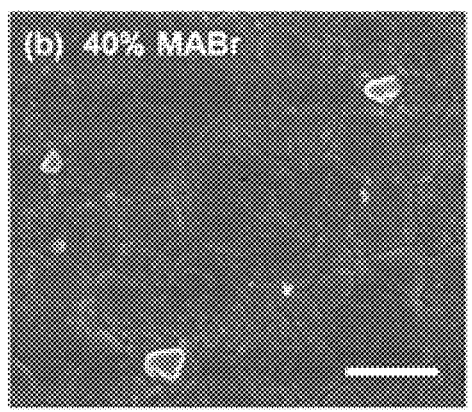
Figure 8C:
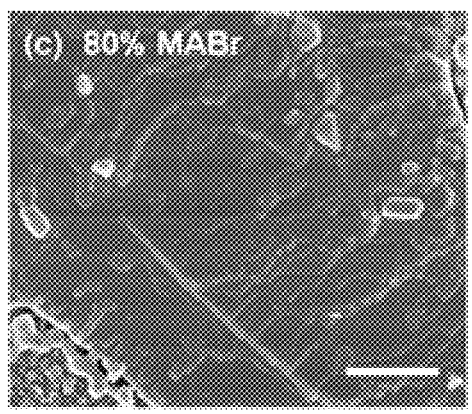
Figure 8D:
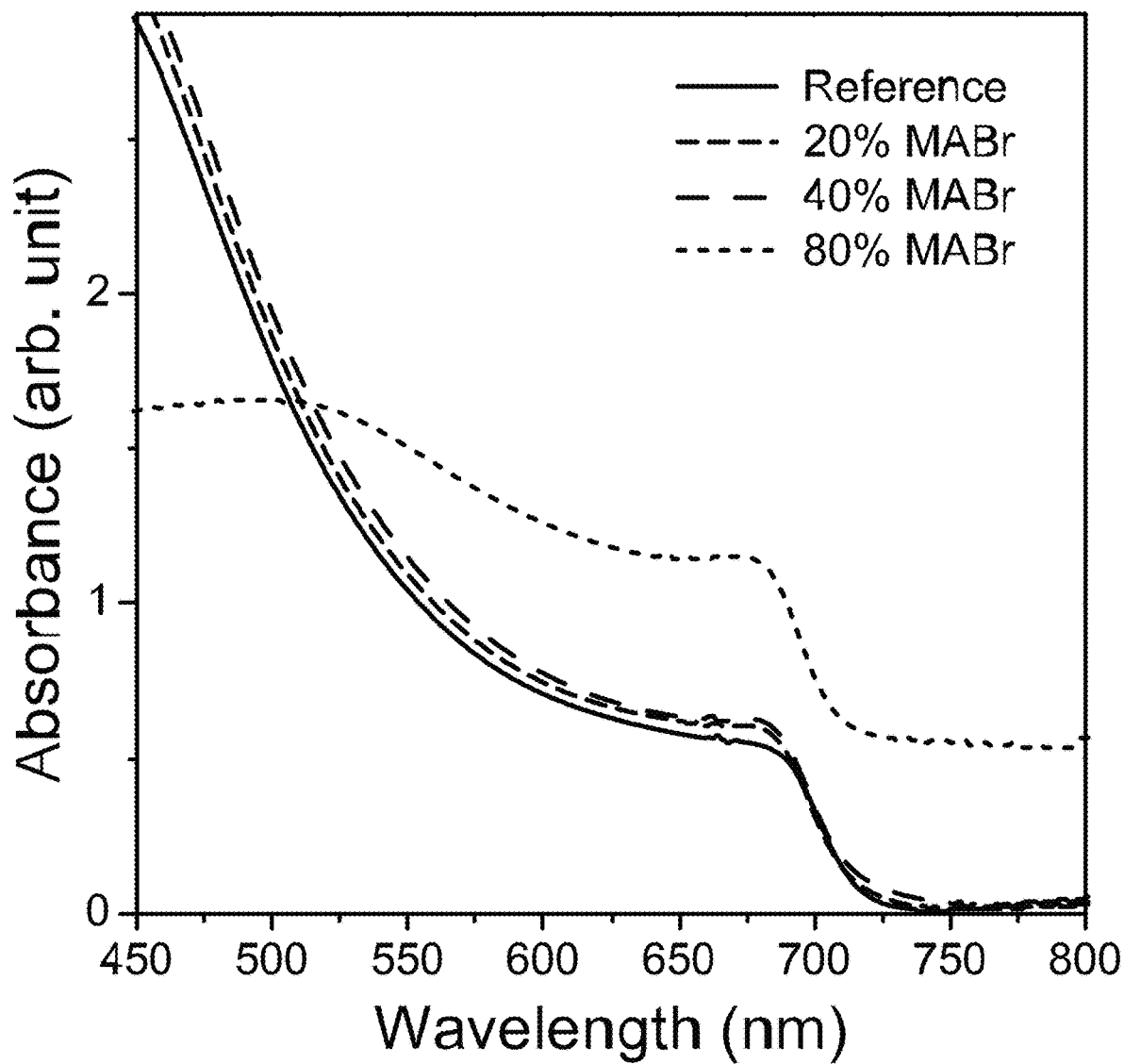
FIG. 8D illustrates the effect of varying MABr concentration on the UV-vis absorption spectra of the final organic-inorganic perovskite films produced, according to some embodiments of the present disclosure.
Figure 8E:
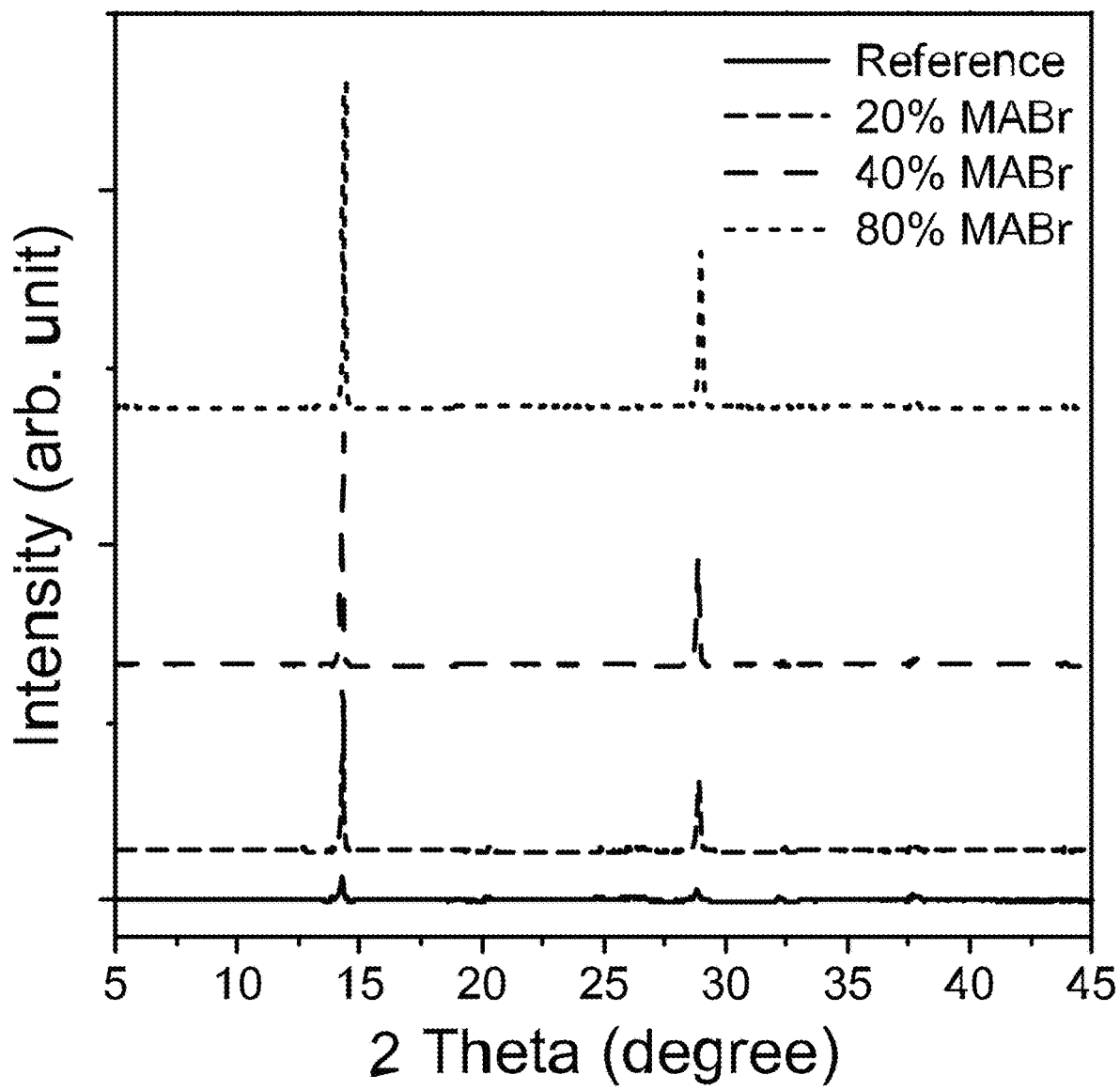
FIG. 8E illustrates the effect of varying MABr concentration on the XRD patterns of the final organic-inorganic perovskite films produced, according to some embodiments of the present disclosure.
Figure 8F:
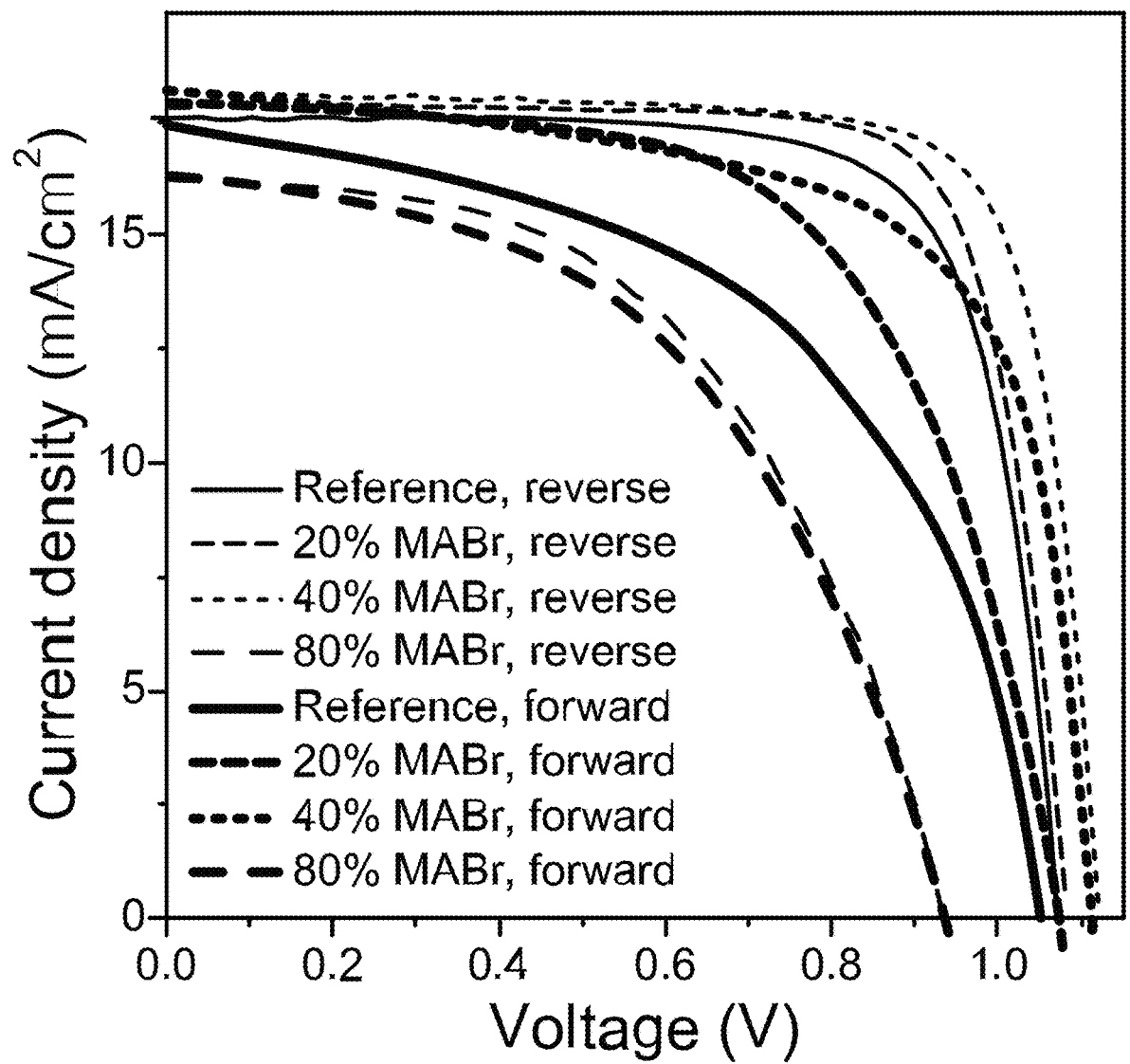
FIG. 8F illustrates the effect of varying MABr concentration on J-V curves, both reverse and forward scans, of the final organic-inorganic perovskite films produced, according to some embodiments of the present disclosure.

The impact of different MABr additive concentrations on the final organic-inorganic perovskites, including film morphology, optical absorption, crystal structure, and device characteristics were also studied. FIGS. 8A, 8B, and 8C show SEM images of the organic-inorganic perovskite films produced using different amounts of MABr additives, from 20% to 80% excess of stoichiometric amounts. There was no significant variation of the grain morphology when MABr additive was changed from 20% to 40%. However, when 80% MABr additive was used, the film morphology was changed significantly with clear evidence of void formation. This is likely caused by the release of large amounts of MABr additive during the film formation process. The deterioration of film morphology with 80% MABr additive is consistent with the much higher base line of the absorption spectrum shown in FIG. 8D. In contrast, the films prepared with 20% and 40% MABr additive showed similar optical absorption spectra as the reference film. FIG. 8E shows that the XRD peak intensity increased with the amount of MABr additive without clearly affecting the peak locations. The typical J-V curves of devices based on organic-inorganic perovskites using non-stoichiometric precursor with different amounts of MABr additive are shown in FIG. 8F. The corresponding statistics of PV parameters are summarized in Table 3 below. When the MABr additive concentration was increased from 20% excess to 40% excess, there was a clear increase in both $V_{oc}$ and FF, leading to improved device efficiency and reduced J-V hysteresis. With a further increase to 80% MABr additive, the average device efficiency dropped substantially from about 15.72% to 7.90%.

Figure 9:
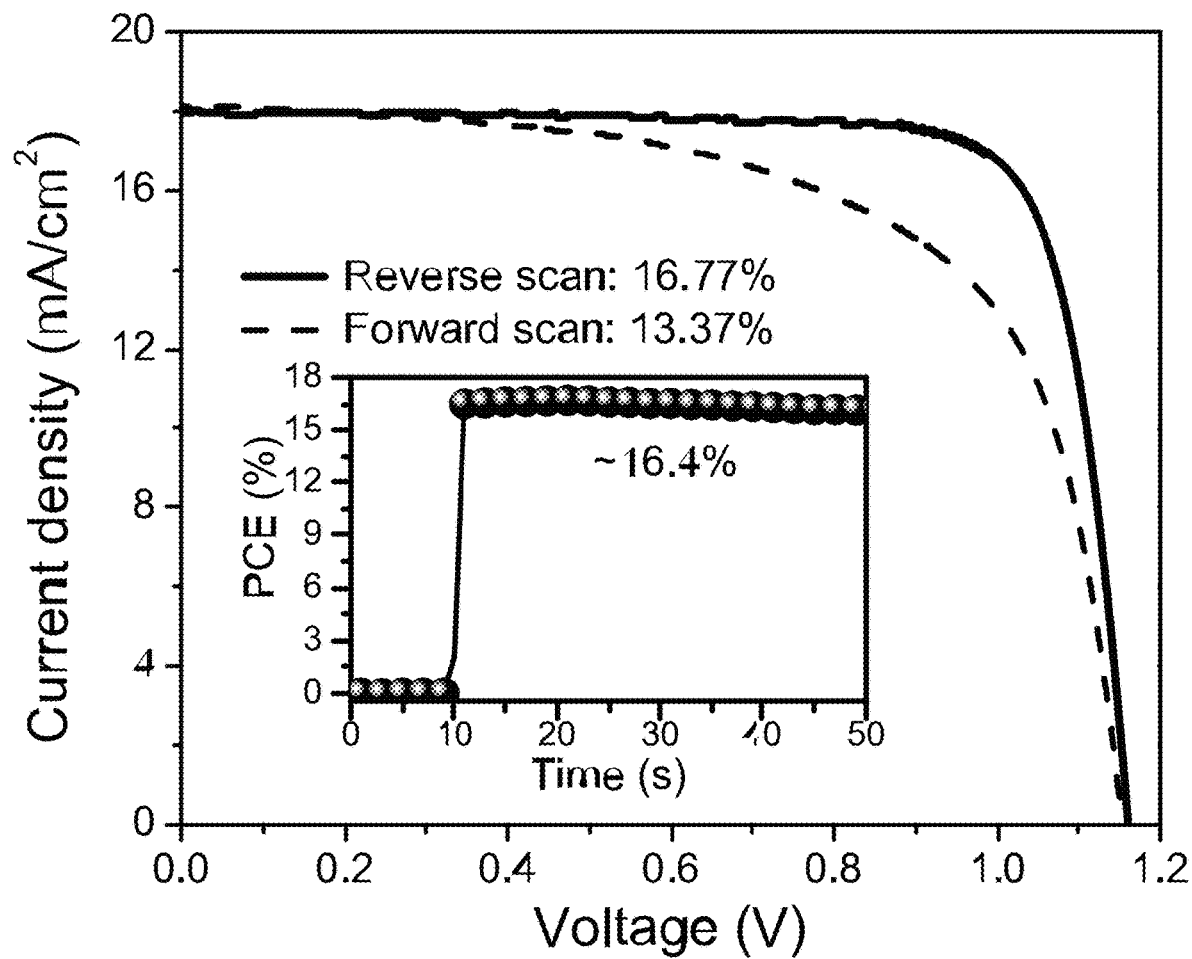
FIG. 9 illustrates the photovoltaic (PV) characteristics of the best-performing device manufactured using 40% MABr additive, according to some embodiments of the present disclosure. J-V curves with both forward and reverse scans as well as the stabilized power output monitored over time near the maximum power point are shown.
Figure 10:
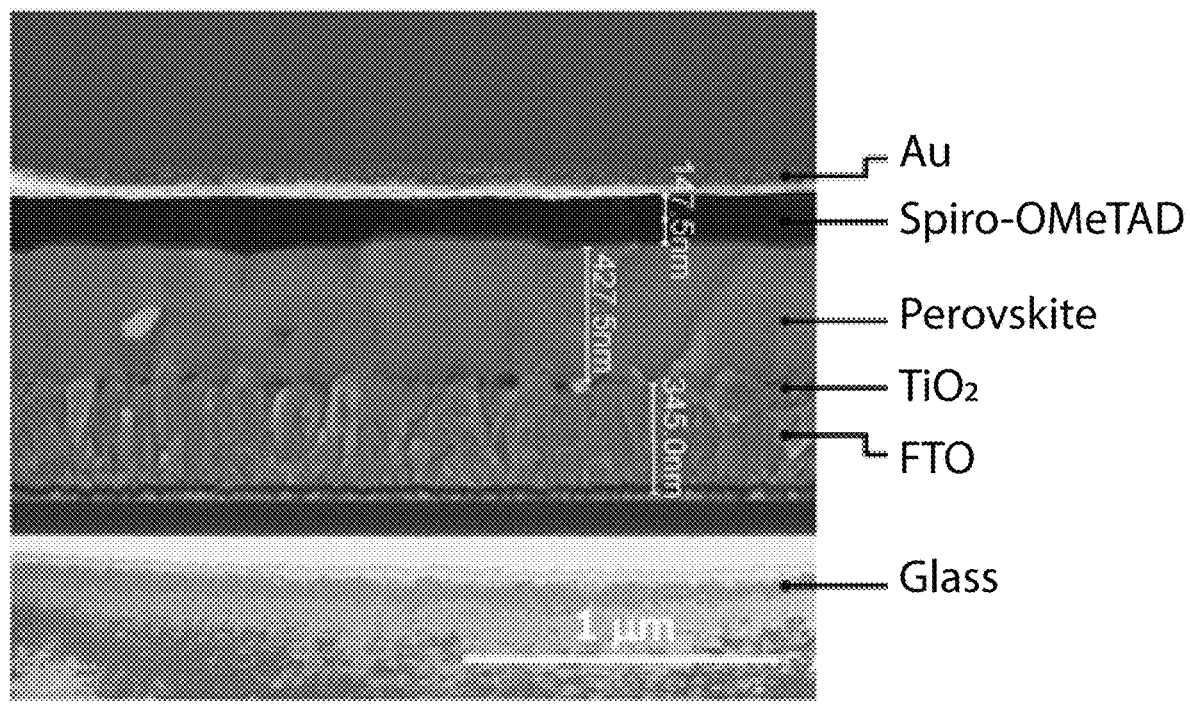
FIG. 10 illustrates a cross-section view of a perovskite solar cell (PSC) having an organic-inorganic perovskite layer produced using non-stoichiometric precursor with excess 40% MABr additive, according to some embodiments of the present disclosure.
Figure 11:
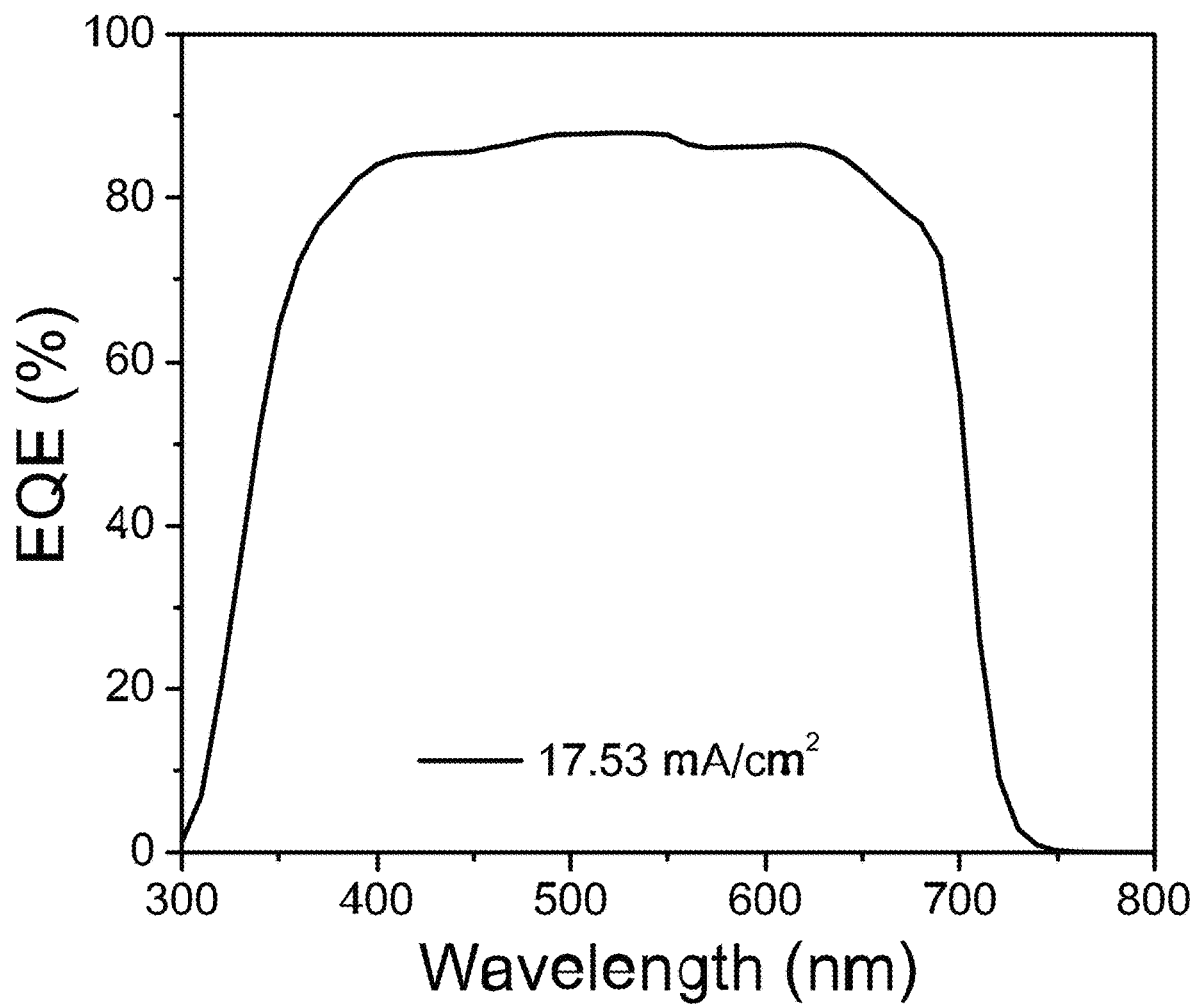
FIG. 11 illustrates an external quantum efficiency (EQE) spectrum of a PSC containing an organic-inorganic perovskite layer, according to some embodiments of the present disclosure. The corresponding J-V curves and stabilized power output are shown in FIG. 9.

This is consistent with the observed deterioration of the film morphology when 80% MABr was used. FIG. 9 shows the J-V curves of the best-performing device using 40% MABr additive with both forward and reverse scans. This device was composed of about 430-nm organic-inorganic perovskite and a cross-section of the device stack is shown in FIG. 10. The reverse and forward J-V scans yield conversion efficiencies of 16.77% and 13.37%, respectively. Because of the hysteresis, the stabilized power output (SPO) near the maximum power point under continuous one-sun illumination was also evaluated. The result is shown in the inset of FIG. 9, where the SPO of ~16.4% is established. The SPO value is close to the efficiency determined from the reverse J-V scan. The EQE spectrum of the champion device is shown in FIG. 11. The integrated current density from EQE spectrum is 17.53 mA/cm$^2$, which is consistent with the $J_{sc}$ value (~17.97 mA/cm$^2$) from the J-V curve.

TABLE 3

Effect of MABr concentration on the statistics of PV parameters for both reverse and forward J-V scans.

|  |  | $J_{sc}$ (mA/cm$^2$) | $V_{oc}$ (V) | FF | PCE (%) |
|---|---|---|---|---|---|
| Reference | reverse | 17.47 ± 0.26 | 1.071 ± 0.007 | 0.726 ± 0.021 | 13.59 ± 0.43 |
|  | forward | 17.39 ± 0.32 | 1.047 ± 0.006 | 0.505 ± 0.024 | 9.20 ± 0.54 |
| 20% MABr | reverse | 17.87 ± 0.18 | 1.102 ± 0.013 | 0.765 ± 0.024 | 15.08 ± 0.60 |
|  | forward | 18.01 ± 0.10 | 1.092 ± 0.017 | 0.570 ± 0.053 | 11.20 ± 0.92 |
| 40% MABr | reverse | 17.99 ± 0.28 | 1.134 ± 0.023 | 0.771 ± 0.014 | 15.72 ± 0.56 |
|  | forward | 18.07 ± 0.14 | 1.127 ± 0.014 | 0.622 ± 0.037 | 12.67 ± 0.83 |
| 80% MABr | reverse | 16.32 ± 0.09 | 0.93 ± 0.058 | 0.520 ± 0.009 | 7.90 ± 0.55 |
|  | forward | 16.32 ± 0.11 | 0.93 ± 0.058 | 0.505 ± 0.014 | 7.69 ± 0.25 |

Figure 12A:
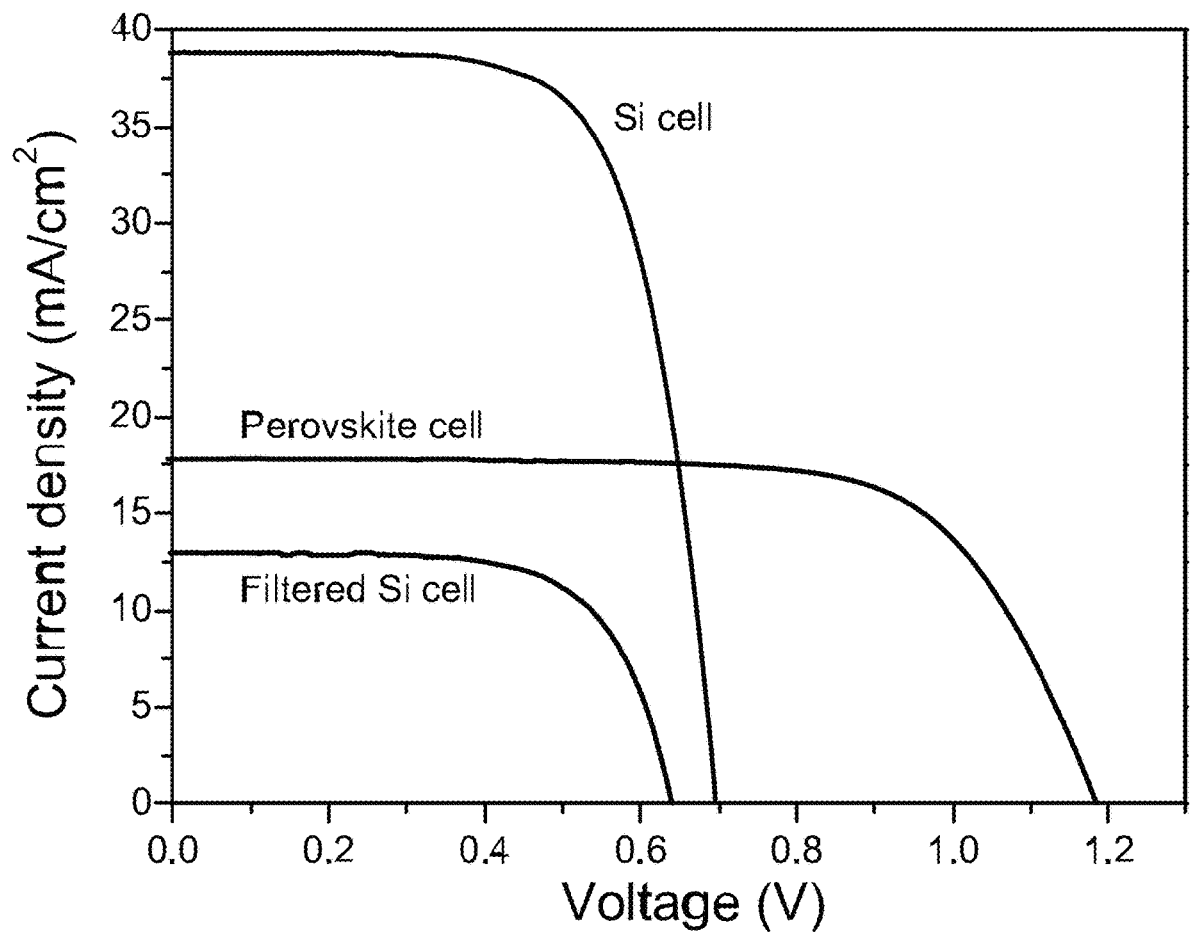
FIGS. 12A and 12B illustrate performance data for a organic-inorganic perovskite-Si 4-terminal tandem device, according to some embodiments of the present disclosure.
Figure 12B:
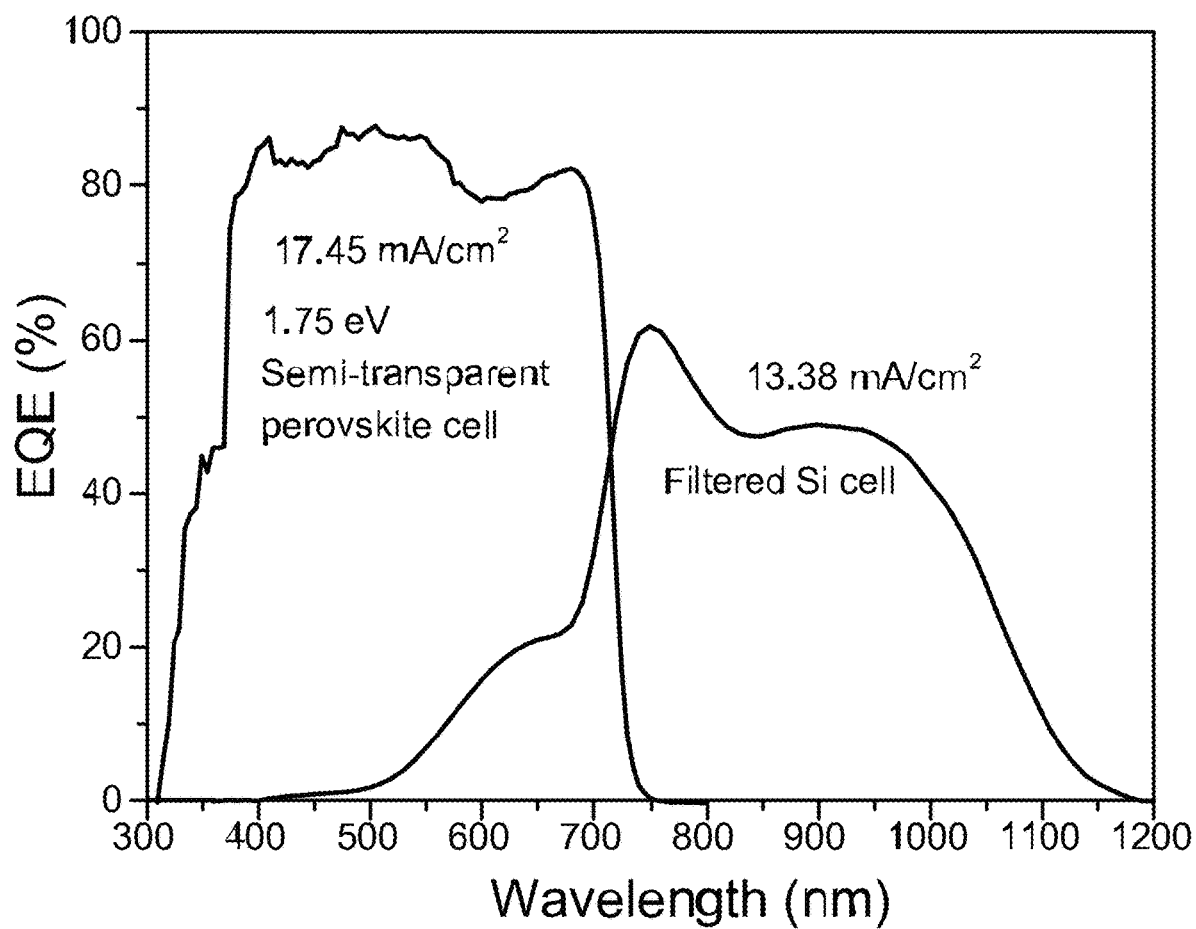
Figure 13:
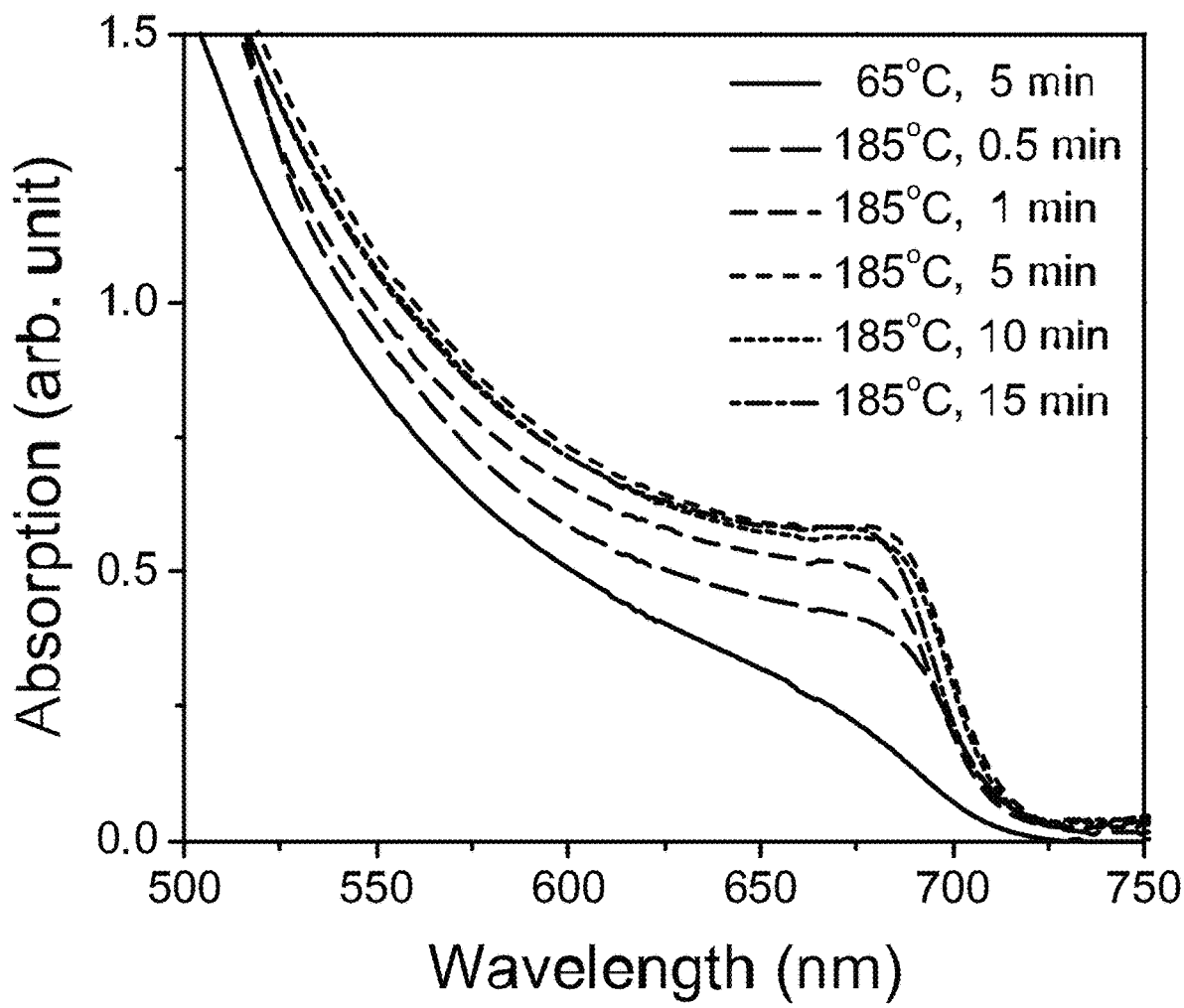
FIG. 13 illustrates the annealing time dependence of the absorption evolution of an organic-inorganic perovskite film prepared from non-stoichiometric precursor with excess 20% MABr additive, according to some embodiments of the present disclosure.

In order to investigate the contribution of our the organic-inorganic perovskites used in tandem solar cells, an organic-inorganic perovskite-Si 4-terminal tandem cell was prepared by mechanically stacking a Si bottom cell with a semi-transparent wide-bandgap (~1.75 eV) organic-inorganic perovskite top cell. FIG. 12A and Table 4 show the corresponding J-V curves and PV parameter summary. For the tandem study, SnO$_2$ was used rather than TiO$_2$ as the electron transport material for the PSC. The use of SnO$_2$ can further increase the $V_{oc}$. For the transparent top contact a stack of 15 nm MoO$_x$, 10 nm Au and 15 nm MoO$_x$ was used. A stack of MoO$_x$/Au/MoO$_x$ not only facilitates the maximization of semi-transparent top cell efficiency due to the formation of continuous ultrathin Au metal layer and reasonable conductivity, but also enables the relatively high transmittance for the top electrode/cell. The semi-transparent WBG PSC exhibited a PCE of 14.7% with a $V_{oc}$ of 1.185 V, a $J_{sc}$ of 17.8 mA cm$^{-2}$, and a FF of 69.7% when measured under reverse voltage scan. With the filter of the semi-transparent WBG top solar cell, the efficiency of the Si bottom cell decreases from 18.6% to 5.6% due to the large reduction in the incident light harvesting by Si active layer. The perovskite-Si 4-terminal tandem cell yields a PCE of 20.3%, which is higher than the semi-transparent perovskite top cell (14.7%) and the unfiltered Si bottom cell (18.6%). As shown in FIG. 12B, the measured EQE-integrated $J_{sc}$'s of the organic-inorganic perovskite top cell and the filtered Si bottom cell are 17.45 and 13.38 mA cm$^{-2}$, respectively, in agreement with the $J_{sc}$'s obtained from their respective J-V curves. It is worth noting that these perovskite-Si 4-terminal tandem cells still have potential to be further improved by using more transparent eletrode stack for semi-transparent perovskite top cells, Si bottom cell with higher efficiency, and more effective optical coupling scheme.

TABLE 4

PV parameters of perovskite top cell, Si bottom cell, and perovskite-Si 4-terminal tandem device.

| Cells | $J_{sc}$ (mA/cm$^2$) | $V_{oc}$ (V) | FF | PCE (%) |
|---|---|---|---|---|
| Perovskite cell | 17.8 | 1.185 | 0.697 | 14.7 |
| Si cell | 38.8 | 0.693 | 0.692 | 18.6 |
| Filtered Si cell | 13.0 | 0.639 | 0.674 | 5.6 |
| 4-Terminal tandem cell | | | | 20.3 |

In summary, the use of non-stoichiometric precursor solutions having excess methylammonium halides additives (MAI, MABr, and MACl) for preparing high-quality organic-inorganic perovskite thin films (~1.75 eV $FA_{0.83}Cs_{0.17}Pb(I_{0.6}Br_{0.4})_3$) for solar cell applications has been demonstrated. In contrast to the standard iodine-based perovskites, the composition of the perovskites containing high bromine content can be affected significantly by the use of excess methylammonium halides additives due to the competition of different halides in the organic-inorganic perovskite lattice. For organic-inorganic mixed-halide perovskites based on Br—I mixtures, excess MAI additive significantly reduced the bandgap due to more iodide incorporation, whereas the use of both MABr and MACl additives showed little impact on the organic-inorganic perovskite composition and crystal structures. Interestingly, excess MABr additive (rather than excess MACl additive) in the non-stoichiometric precursor showed the strongest effect on improving both the crystallographic properties (e.g., crystallinity and orientation) and the device characteristics.

Methods:

Organic-Inorganic perovskite and device fabrication. Fluorine doped tin oxide (FTO, TEC15, Hartford glass Co) was patterned using Zn powder and HCl (~5M). Compact $TiO_2$ (c-$TiO_2$) film was deposited on thoroughly cleaned substrate by spray pyrolysis using 0.2 M titanium diisopropoxide bis(acetylacetonate) in 1-butanol solution. PCBM (20 mg/ml in dichlorobenzene) was span at 4000 rpm for 30 s on top of c-$TiO_2$, followed by 1 hr annealing at 100° C. Organic-inorganic perovskite precursor solutions, targeting a final organic-inorganic perovskite composition of $FA_{0.83}Cs_{0.17}Pb(I_{0.6}Br_{0.4})_3$, was composed of 0.17M CsI, 0.83 M FAI, 0.6 M PbBr$_2$, 0.4 M PbI$_2$ precursors in a DMF solution. 50 µl of HI acid and 27 µl of HBr acid were added into 1 ml precursor. Different amounts of additives, eg. 0.2 M MAI, MABr, MACl, were added to the prepared precursor solution. The precursor solution was deposited by spin-coating 100 µl precursor at 3000 rpm for 30 s. The resultant transparent yellow liquid film was transferred onto a hot-plate at 65° C. for 5 min, and then at 185° C. with a petri-dish covered for 10 min, resulting in the final, solid organic-inorganic perovskite layer. A hole transport layer (HTL) was spin-coated at 4000 rpm for 30 s with a HTL solution consisting of 80 mg 2,2',7,7'-tetrakis(N,N-dip-methoxyphenylamine)-9,9'-spirobifluorene (Spiro-OMeTAD; Merck), 30 µL bis(trifluoromethane) sulfonimide lithium salt stock solution (500 mg Li-TFSI in 1 mL acetonitrile), and 30 µl 4-tert-butylpyridine (TBP), and 1 mL chlorobenzene solvent. Finally, a 150 nm Ag layer was deposited on the HTL layer by thermal evaporation for the top contact.

Semi-transparent device fabrication. For the (~1.75 eV) semi-transparent top organic-inorganic perovskite cell, $SnO_2$ was used as the electron transport material (ETM). The $SnO_2$ ETM was deposited onto pre-patterned and cleaned FTO substrates by plasma-enhanced atomic layer deposition (Ensure Scientific Group AutoALD-PE V2.0). The substrate was then sequentially deposited by a $C_{60}$-SAM layer, organic-inorganic perovskite film, and spiro-OMeTAD as the hole transport material (HTM). Finally, the sequence of 15 nm MoO$_x$, 10 nm Au, and 15 nm MoO$_x$ were thermally evaporated through a patterned mask onto the HTM.

Film and device characterization. The optical absorption spectra of the organic-inorganic perovskite films were measured using a UV-vis spectrophotometer with the aid of an integrated sphere (Cary-6000i, Agilent) The morphologies of the prepared organic-inorganic perovskite films and the cross-sectional structure and thickness of the solar cells were investigated using a feld-emission scanning electron microscopy (FESEM, Quanta 600, FEI). J-V curves were measured in air under 100 mW/cm$^2$ simulated AM1.5G solar irradiation with a Keithley 2400 Source Meter. The light intensity for J-V measurements was calibrated by a standard Si solar cell. EQE spectra were measured from 300 to 800 nm for perovskite solar cells and from 300 to 1200 nm for Si cells using a QE system from PV Measurements Inc. All characterizations and measurements were performed in the ambient condition. The stabilized current and power output were measured using a potentiostat (Princeton Applied Research, VersaSTAT MC).

4-terminal tandem cell measurements. The measurements were performed using the standard methods. In brief, the J-V curves of semitransparent top organic-inorganic perovskite cells were measured under 100 mW/cm$^2$ AM1.5G solar irradiation. EQE spectra were performed on a QE system. Each semitransparent wide-bandgap top cell consists of multiple subcells with small and large active areas as defined by the areas of the metal electrodes. The small subcells have similar active areas as the bottom cells and are used for J-V measurements. The large subcells are used to filter the bottom cells for easy cell alignment. The J-V curve and EQE spectrum of Si bottom cell were taken by putting such a semitransparent wide-bandgap top cell with a large active area on top as a filter.

As used herein, the term "about" accounts for naturally occurring errors in measuring any quantitative value. For example, the phrase "$C_1$*W is about equal to x" refers to $C_1$*W not only equaling x, but also equaling values close to x within reasonable limits, for example x L, where L may be between 0.01 and 0.1 inclusively.

EXAMPLES

Example 1

A method comprising: treating a liquid comprising a first precursor at a concentration $C_1$, a second precursor at a concentration $C_2$, a third precursor at a concentration $C_3$, and an additive at a concentration $C_4$, wherein: the treating results in a perovskite, each of $C_1$, $C_2$, and $C_3$ are between 0.001 M and 100 M, inclusively, and at least one of $C_4/C_1$, $C_4/C_2$, or $C_4/C_3$ equals a ratio greater than or equal to zero.

Example 2

The method of Example 1, wherein the perovskite comprises a first cation (A) having a 1+ valence state.

Example 3

The method of either Examples 1 or 2, wherein the perovskite comprises a second cation (B) having a valence state of at least one of 1+, 2+, 3+, or 4+.

Example 4

The method of any one of Examples 1-3, wherein the perovskite comprises a first anion (X) having a valence state of 1−.

Example 5

The method of any one of Examples 1-4, wherein X comprises a halogen.

Example 6

The method of any one of Examples 1-5, wherein: the perovskite comprises: a first cation (A) having a 1+ valence state; a second cation (B) having a valence state of at least one of 1+, 2+, 3+, or 4+; and a first anion (X) having a valence state of 1−.

Example 7

The method of any one of Examples 1-6, wherein the perovskite has a composition comprising at least one of $ABX_3$, $A_2BB'X_6$, $A_2BX_6$, or $A_3B_2X_9$.

Example 8

The method of any one of Examples 1-7, wherein: the perovskite further comprises a third cation (A'), and the composition comprises $A_xA'_{1-x}BX_3$, where $0 \le x \le 1$.

Example 9

The method of any one of Examples 1-8, wherein: the first precursor comprises AX, the second precursor comprises A'X, the third precursor comprises $BX_2$, and the additive comprises at least one of AX, A'X, or A"X.

Example 10

The method of any one of Examples 1-9, wherein: $W*C_1$ is about equal to x, $W*C_2$ is about equal to (1−x), $W*2*C_3$ is about equal to one, $<W<1000$, and W is a scaling factor having units of inverse concentration.

Example 11

The method of any one of Examples 1-10, wherein A comprises at least one of an alkylammonium, a Group I Element, or formamidinium.

Example 12

The method of any one of Examples 1-11, wherein the alkylammonium comprises at least one of methylammonium (MA), ethylammonium, or butylammonium.

Example 13

The method of any one of Examples 1-12, wherein the Group I Element comprises at least one of potassium, cesium, or rubidium.

Example 14

The method of any one of Examples 1-13, wherein A' comprises at least one of an alkylammonium, a Group I Element, or formamidinium.

Example 15

The method of any one of Examples 1-14, wherein the alkylammonium comprises at least one of methylammonium (MA), ethylammonium, or butylammonium.

Example 16

The method of any one of Examples 1-15, wherein the Group I Element comprises at least one of potassium, cesium, or rubidium.

Example 17

The method of any one of Examples 1-16, wherein B comprises at least one of germanium, tin, or lead.

Example 18

The method of any one of Examples 1-17, wherein: AX comprises cesium iodide or cesium bromide, A'X comprises formamidinium iodide (FAI) or FABr, $BX_2$ comprises $PbI_2$ or $PbBr_2$, the additive comprises an alkylammonium halide, and the composition comprises $FA_xCs_{1-x}PbI_3$ or $FA_xCs_{1-x}PbBr_3$.

Example 19

The method of any one of Examples 1-18, wherein the alkylammonium halide comprises at least one of MABr, MAI, or MACl.

Example 20

The method of any one of Examples 1-19, wherein the ratio is between greater than zero and less than 0.5.

Example 21

The method of any one of Examples 1-20, wherein the liquid further comprises: a fourth precursor comprising $BX'_2$ at a concentration $C_5$, wherein: X' comprises a second anion having a 1− valence state, the composition comprises $A_xA'_{1-x}B(X_yX'_{1-y})_3$, where $0<y<1$, $W*2*C_5$ equals about (1−y), and $W*2*C_3$ equals about y.

Example 22

The method of any one of Examples 1-21, wherein: AX comprises at least one of cesium iodide or cesium bromide, A'X comprises at least one of FAI or FABr, BX$_2$ comprises PbBr$_2$, BX'$_2$ comprises PbI$_2$, the additive comprises at least one of an alkylammonium halide, and the composition comprises FA$_x$Cs$_{1-x}$Pb(I$_y$Br$_{1-y}$)$_3$.

Example 23

The method of any one of Examples 1-22, wherein the composition comprises FA$_{0.83}$Cs$_{0.17}$Pb(I$_{0.6}$Br$_{0.4}$)$_3$.

Example 24

The method of any one of Examples 1-23, wherein the alkylammonium halide comprises at least one of MABr, MAI, or MACl.

Example 25

The method of any one of Examples 1-24, wherein the liquid further comprises: a fifth precursor comprising at least one of B'X$_2$, B'X'$_2$, at a concentration C$_6$, wherein: B' comprises a fourth cation having a valence state of at least one of 1+, 2+, 3+, or 4+, the composition comprises A$_x$A'$_{1-x}$B$_z$B'$_{1-z}$(X$_y$X'$_{1-y}$)$_3$, where 0<z<1, W*C$_5$ equals about z, and W*C$_6$ equals about (1-y).

Example 26

The method of any one of Examples 1-25, wherein: AX comprises at least one of cesium iodide or cesium bromide, A'X comprises at least one of FAI or FABr, BX$_2$ comprises at least one of PbBr$_2$ or PbI$_2$, BX'$_2$ comprises at least one of PbBr$_2$ or PbI$_2$, B' comprises at least one of germanium or tin, the additive comprises at least one of an alkylammonium halide, and the composition comprises FA$_x$Cs$_{1-x}$Pb$_z$B'$_{z-1}$(I$_y$Br$_{1-y}$)$_3$.

Example 27

The method of any one of Examples 1-26, wherein the alkylammonium halide comprises at least one of MABr, MAI, or MACl.

Example 28

The method of any one of Examples 1-27, wherein the perovskite has a bandgap greater than or equal to 1.6 eV.

Example 29

The method of any one of Examples 1-28, wherein the perovskite has a bandgap between 1.6 eV and 2.5 eV, inclusively.

Example 30

The method of any one of Examples 1-29, wherein the perovskite has a bandgap less than or equal to 1.5 eV.

Example 31

The method of any one of Examples 1-30, wherein the perovskite has a bandgap between 1.2 eV and 1.5 eV, inclusively.

Example 32

The method of any one of Examples 1-31, wherein the treating comprises thermal treating.

Example 33

The method of any one of Examples 1-32, wherein the thermal treating comprises heating the solution to an average bulk temperature of greater than 25° C.

Example 34

The method of any one of Examples 1-33, wherein the thermal treating comprises heating the solution to an average bulk temperature less than 150° C.

Example 35

The method of any one of Examples 1-34, wherein the treating comprises exposing the liquid to a gas stream.

Example 36

The method of any one of Examples 1-35, wherein the gas comprises at least one of nitrogen, helium, neon, argon, or xenon.

Example 37

The method of any one of Examples 1-36, wherein the gas is air.

Example 38

The method of any one of Examples 1-37, wherein the treating is performed for a period of time between one minute and 10 hours.

Example 39

The method of any one of Examples 1-38, wherein the period of time is between one minute and one hour.

Example 40

The method of any one of Examples 1-39, wherein the liquid further comprises a solvent.

Example 41

The method of any one of Examples 1-40, wherein the solvent comprises at least one of water or an organic solvent.

Example 42

The method of any one of Examples 1-41, wherein the solvent has a boiling point less than or equal to the average bulk temperature.

Example 43

The method of any one of Examples 1-42, wherein the organic solvent comprises at least one of dimethyl formamide, dimethyl sulfoxide, an alcohol, or a benzene-containing component.

Example 44

A perovskite comprising: A$_x$A'$_{1-x}$B$_z$B'$_{1-z}$(X$_y$X'$_{1-y}$)$_3$, wherein: A is a first cation having a 1+ valence state, A' is a second cation having a 1+ valence state, B is a third cation having a 2+ valence state, B' is a fourth cation having a 2+ valence state, X is a first anion having a valence state of 1−, X' is a second anion having a valence state of 1−, and each of x, y, and z are between zero and one, exclusively.

Example 45

The perovskite of Example 44, wherein A comprises at least one of an alkylammonium, a Group I Element, or formamidinium.

Example 46

The perovskite of either Examples 44 and 45, wherein the alkylammonium comprises at least one of methylammonium (MA), ethylammonium, or butylammonium.

Example 47

The perovskite of any one of Examples 44-46, wherein the Group I Element comprises at least one of potassium, cesium, or rubidium.

Example 48

The perovskite of any one of Examples 44-47, wherein A' comprises at least one of an alkylammonium, a Group I Element, or formamidinium.

Example 49

The perovskite of any one of Examples 44-48, wherein the alkylammonium comprises at least one of methylammonium (MA), ethylammonium, or butylammonium.

Example 50

The perovskite of any one of Examples 44-49, wherein the Group I Element comprises at least one of potassium, cesium, or rubidium.

Example 51

The perovskite of any one of Examples 44-50, wherein B comprises at least one of germanium, tin, or lead.

Example 52

The perovskite of any one of Examples 44-51, wherein B' comprises at least one of germanium, tin, or lead.

Example 53

The perovskite of any one of Examples 44-52, wherein X comprises a halogen.

Example 54

The perovskite of any one of Examples 44-53, wherein X' comprises a halogen.

Example 55

The perovskite of any one of Examples 44-54, wherein the perovskite comprises $FA_xCs_{1-x}Pb(I_yBr_{1-y})_3$.

Example 56

The perovskite of any one of Examples 44-55, wherein the perovskite comprises $FA_{0.83}Cs_{0.17}Pb(I_{0.6}Br_{0.4})_3$.

The foregoing discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

What is claim is:

1. A method comprising:
    treating a liquid comprising a first precursor at a concentration $C_1$, a second precursor at a concentration $C_2$, a third precursor at a concentration $C_3$, a fourth precursor, and an additive at a concentration $C_4$, wherein:
    the first precursor comprises cesium and a first halide comprising at least one of iodide or bromide,
    the second precursor comprises formamidinium (FA) and a second halide comprising at least one of iodide or bromide,
    the third precursor comprises $PbBr_2$,
    the fourth precursor comprises $PbI_2$,
    the additive comprises at least one of methylammonium bromide (MABr) or methylammonium iodide (MAI),
    the treating results in a perovskite comprising $FA_xCs_{1-x}Pb(I_yBr_{1-y})_3$ that is substantially free of MA,
    $0<x<1$,
    $0<y<1$,
    each of $C_1$, $C_2$, and $C_3$ are between 0.001 M and 100 M, inclusively, and
    at least one of $C_4/C_1$ or $C_4/C_2$ equals a ratio greater than or equal to zero.

2. The method of claim 1, wherein the ratio is between greater than zero and less than 0.5.

3. The method of claim 1, wherein the composition comprises approximately $FA_{0.83}Cs_{0.17}Pb(I_{0.6}Br_{0.4})_3$.

4. The method of claim 1, wherein the perovskite has a bandgap greater than or equal to 1.6 eV.

5. The method of claim 1, wherein the liquid comprises a solvent.

6. The method of claim 5, wherein the treating comprises heating the liquid resulting in removal of the solvent.

7. The method of claim 5, wherein the treating comprises exposing the liquid to a gas stream resulting in removal of the solvent.

8. The method of claim 1, wherein the first halide is different than the second halide.

* * * * *